US011637025B2

(12) United States Patent
Tabata et al.

(10) Patent No.: US 11,637,025 B2
(45) Date of Patent: Apr. 25, 2023

(54) APPARATUS FOR SELECTIVELY ETCHING FIRST REGION MADE OF SILICON NITRIDE AGAINST SECOND REGION MADE OF SILICON OXIDE

(71) Applicant: Tokyo Electron Limited, Tokyo (JP)

(72) Inventors: Masahiro Tabata, Miyagi (JP); Sho Kumakura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 322 days.

(21) Appl. No.: 16/794,391

(22) Filed: Feb. 19, 2020

(65) Prior Publication Data

US 2020/0185238 A1   Jun. 11, 2020

Related U.S. Application Data

(63) Continuation of application No. 16/394,089, filed on Apr. 25, 2019, now Pat. No. 10,600,660, which is a
(Continued)

(30) Foreign Application Priority Data

Dec. 13, 2016   (JP) .............................. JP2016-240871
Apr. 25, 2017   (JP) .............................. JP2017-086521

(51) Int. Cl.
*C23C 16/00*       (2006.01)
*H01L 21/306*      (2006.01)
(Continued)

(52) U.S. Cl.
CPC ........ *H01L 21/67069* (2013.01); *H01J 37/00* (2013.01); *H01J 37/32137* (2013.01);
(Continued)

(58) Field of Classification Search
CPC ........... H01J 37/32137; H01J 37/32174; H01J 37/32449; H01L 21/31116; H01L 21/67069
See application file for complete search history.

(56) References Cited

U.S. PATENT DOCUMENTS 6,828,237 B1 * 12/2004 Chan .................... H01L 21/0338
                                                          438/689
7,977,249 B1    7/2011 Liu et al.
(Continued)

FOREIGN PATENT DOCUMENTS

JP    2003-229418 A    8/2003
JP    2009-206500 A    9/2009
(Continued)

*Primary Examiner* — Luz L Alejandro Mulero
(74) *Attorney, Agent, or Firm* — Pearne & Gordon LLP

(57) ABSTRACT

Generation of a deposit can be suppressed and high selectivity can be acquired when etching a first region made of silicon nitride selectively against a second region made of silicon oxide. A method includes preparing a processing target object having the first region and the second region within a chamber provided in a chamber main body of a plasma processing apparatus; generating plasma of a first gas including a gas containing hydrogen within the chamber to form a modified region by modifying a part of the first region with active species of the hydrogen; and generating plasma of a second gas including a gas containing fluorine within the chamber to remove the modified region with active species of the fluorine.

18 Claims, 24 Drawing Sheets

Related U.S. Application Data continuation of application No. 15/837,195, filed on Dec. 11, 2017, now Pat. No. 10,319,613.

(51) Int. Cl.
*H01L 21/67* (2006.01)
*H01L 21/311* (2006.01)
*H01J 37/32* (2006.01)
*H01J 37/00* (2006.01)

(52) U.S. Cl.
CPC .. *H01J 37/32174* (2013.01); *H01L 21/31116* (2013.01); *H01L 21/67* (2013.01); *H01J 37/32449* (2013.01); *H01J 2237/334* (2013.01)

(56) References Cited

U.S. PATENT DOCUMENTS

| | | | |
|---|---|---|---|
| 8,980,758 B1 * | 3/2015 | Ling | H01L 21/31116 438/724 |
| 2008/0081104 A1 * | 4/2008 | Hasebe | H01L 21/0228 118/696 |
| 2010/0170871 A1 * | 7/2010 | Sone | H01L 21/0273 216/58 |
| 2011/0318936 A1 * | 12/2011 | Ko | H01L 21/31116 438/724 |
| 2013/0029494 A1 * | 1/2013 | Sasaki | H01J 37/32192 438/724 |
| 2015/0079797 A1 * | 3/2015 | Chen | H01L 21/3065 438/711 |

FOREIGN PATENT DOCUMENTS

| | | |
|---|---|---|
| JP | 2012-505530 A | 3/2012 |
| JP | 2014-514729 A | 6/2014 |
| JP | 2016-532313 A | 10/2016 |
| KR | 10-2012-0120400 A | 11/2012 |
| KR | 10-2016-0055877 A | 5/2016 |
| WO | 2010/042552 A2 | 4/2010 |
| WO | 2011/108663 A1 | 9/2011 |
| WO | 2012/121921 A2 | 9/2012 |
| WO | 2015/041747 A1 | 3/2015 |

* cited by examiner

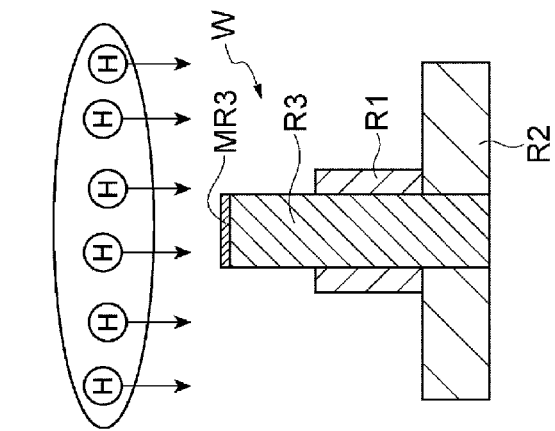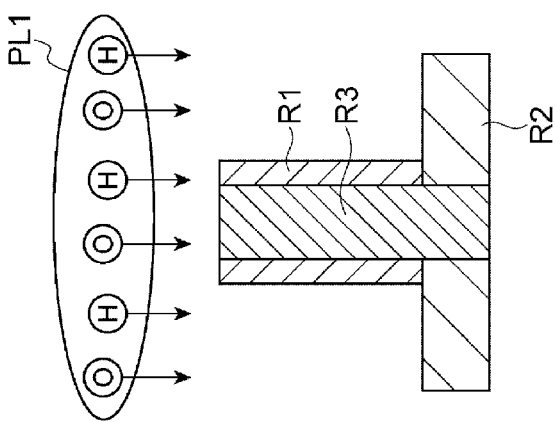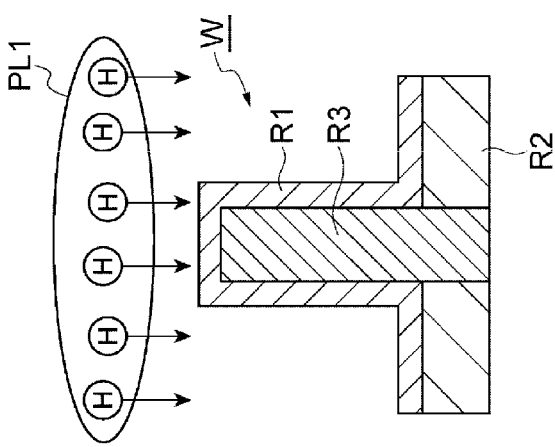

|  | ΔL2(nm) | ΔL3(nm) |
|---|---|---|
| COMPARATIVE SAMPLE | 14.9 | 7.9 |
| EXPERIMENT SAMPLE 1 | 0.0 | 19.9 |
| EXPERIMENT SAMPLE 2 | 0.0 | 0.0 |

APPARATUS FOR SELECTIVELY ETCHING FIRST REGION MADE OF SILICON NITRIDE AGAINST SECOND REGION MADE OF SILICON OXIDE

CROSS-REFERENCE TO RELATED APPLICATION

This is a continuation application of U.S. patent application Ser. No. 16/394,089, filed on Apr. 25, 2019, which is a continuation of U.S. patent application Ser. No. 15/837,195, filed on Dec. 11, 2017 and now issued as U.S. Pat. No. 10,319,613, which claims the benefit of Japanese Patent Application Nos. 2016-240871 and 2017-086521 filed on Dec. 13, 2016 and Apr. 25, 2017, respectively, the entire disclosures of which are incorporated herein by reference.

TECHNICAL FIELD

The embodiments described herein pertain generally to a method of etching a first region made of silicon nitride selectively against a second region made of silicon oxide.

BACKGROUND

In the manufacture of an electronic device such as a semiconductor device, it may be required to etch one of two regions made of different materials selectively against the other. For example, it may be needed to etch a first region made of silicon nitride selectively against a second region made of silicon oxide.

Generally, in order to etch the first region made of the silicon nitride selectively against the second region made of the silicon oxide, plasma etching using a hydrofluorocarbon gas is performed. In the plasma etching using the hydrofluorocarbon gas, the first region is etched by active species in plasma while the second region is protected by a deposit of fluorocarbon. This plasma etching is described in Patent Document 1.

Patent Document 1: Japanese Patent Laid-open Publication No. 2003-229418

To etch the first region made of the silicon nitride selectively against the second region made of the silicon oxide, however, a selectivity higher than a selectivity in the plasma etching using the hydrofluorocarbon gas is needed.

Furthermore, in the plasma etching using the hydrofluorocarbon gas, the second region is protected by using the deposit as stated above. If, however, a narrow opening is formed as the etching of the first region progresses, the opening may be clogged with the corresponding deposit, so that the etching of the first region is stopped.

In view of the foregoing, when etching the first region made of the silicon nitride selectively against the second region made of the silicon oxide, it is required to suppress generation of the deposit and acquire the high selectivity.

SUMMARY

In one exemplary embodiment, there is provided a method of etching a first region made of silicon nitride selectively against a second region made of silicon oxide. The method includes (i) preparing a processing target object having the first region and the second region within a chamber provided in a chamber main body of a plasma processing apparatus; (ii) generating plasma of a first gas including a gas containing hydrogen within the chamber to form a modified region by modifying a part of the first region with active species of the hydrogen (hereinafter, referred to as "modifying process"); and (iii) generating plasma of a second gas including a gas containing fluorine within the chamber to remove the modified region with active species of the fluorine (hereinafter, referred to as "removing process").

In the method, the part of the first region is modified by the active species of the hydrogen generated in the modifying process and becomes the modified region which can be easily removed by the active species of the fluorine. Meanwhile, since the second region made of silicon oxide is stabilized, the second region is not modified by the active species of the hydrogen. Accordingly, in the removing process, the modified region is removed selectively against the second region. Therefore, according to the method, the first region is selectively etched against the second region. Furthermore, the active species in the plasma generated in the modifying process and the removing process have a very low deposition property as compared to active species of plasma of a hydrofluorocarbon gas, or has substantially no deposition property. Thus, according to the method, generation of a deposit is suppressed.

The processing target object may be placed, within the chamber, on a stage including therein an electrode to which a high frequency power for attracting ions onto the processing target object, that is, a high frequency bias power is allowed to be supplied. The high frequency bias power may be supplied to the electrode in the modifying process. According to the exemplary embodiment, the modification of the first region is more efficiently performed. The high frequency bias power may not be supplied to the electrode in the generating of the plasma of the second gas. According to the exemplary embodiment, the modified region is removed by, not a sputter etching by ions, a chemical reaction between the modified region and the active species of the fluorine.

The second gas may include a $NF_3$ gas as the gas containing fluorine.

The second gas may further include hydrogen. A ratio of a number of atoms of the hydrogen in the second gas to a number of atoms of the fluorine in the second gas is equal to or higher than 8/9. By the plasma of the second gas, etching selectivity of the first region is further improved.

The second gas may include a $NF_3$ gas as the gas containing fluorine, and may further include a $H_2$ gas. A flow rate ratio of the $H_2$ gas in the second gas to the $NF_3$ gas in the second gas may be equal to or higher than 3/4. By the plasma of the second gas, the etching selectivity of the first region is further improved.

The first gas may include a $H_2$ gas as the gas containing hydrogen.

A plurality of sequences each of which includes the modifying process and the removing process may be performed in sequence.

The processing target object may further have a third region made of silicon. The first gas may further include a gas containing oxygen. In the modifying process of the present exemplary embodiment, a surface of the third region is oxidized by active species of oxygen in the first gas, and etching of the third region is suppressed in the etching by the removing process. Accordingly, the first region is etched selectively against the second region and the third region. The first region may be provided to cover the second region and the third region.

A plurality of sequences each of which includes the modifying process and the removing process are performed in sequence. The processing target object further has a third region made of silicon. The first region is provided to cover the second region and the third region before the plurality of sequences are performed. The plurality of sequences include one or more first sequences and one or more second sequences. Among the plurality of sequences, the one or more first sequences are performed until a time immediately before the third region is exposed or until the third region is exposed. Among the plurality of sequences, the one or more second sequences are performed to oxidize a surface of the third region after the one or more first sequences. The first gas further includes a gas containing oxygen in at least one second sequence. In the modifying process of the present exemplary embodiment, the surface of the third region is oxidized and the etching of the third region is suppressed in the etching by the removing process. Accordingly, the first region is etched selectively against the second region and the third region.

The first gas may not contain the gas containing oxygen in the one or more first sequences. The plurality of sequences may further include one or more third sequences. Among the plurality of sequences, the one or more third sequences are performed after the one or more second sequences. Only in the one or more third sequences, or in the one or more third sequences in addition to the one or more first sequences, the first gas may not include the gas containing oxygen.

A flow rate ratio of the gas containing oxygen in the first gas to the gas containing hydrogen in the first gas may be set to be in a range from $3/100$ to $9/100$. According to the present exemplary embodiment, the first region can be etched against the third region with a higher selectivity.

The gas containing oxygen may be an $O_2$ gas.

According to the exemplary embodiments, it is possible to suppress the generation of the deposit and achieve the high selectivity in etching the first region made of the silicon nitride selectively against the second region made of the silicon oxide.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 12A to FIG. 12C are diagrams for respectively describing a process ST1 of a first sequence, a process ST1 of a second sequence and a process ST1 of a third sequence in the method shown in FIG. 11;

DETAILED DESCRIPTION

Figure 1:
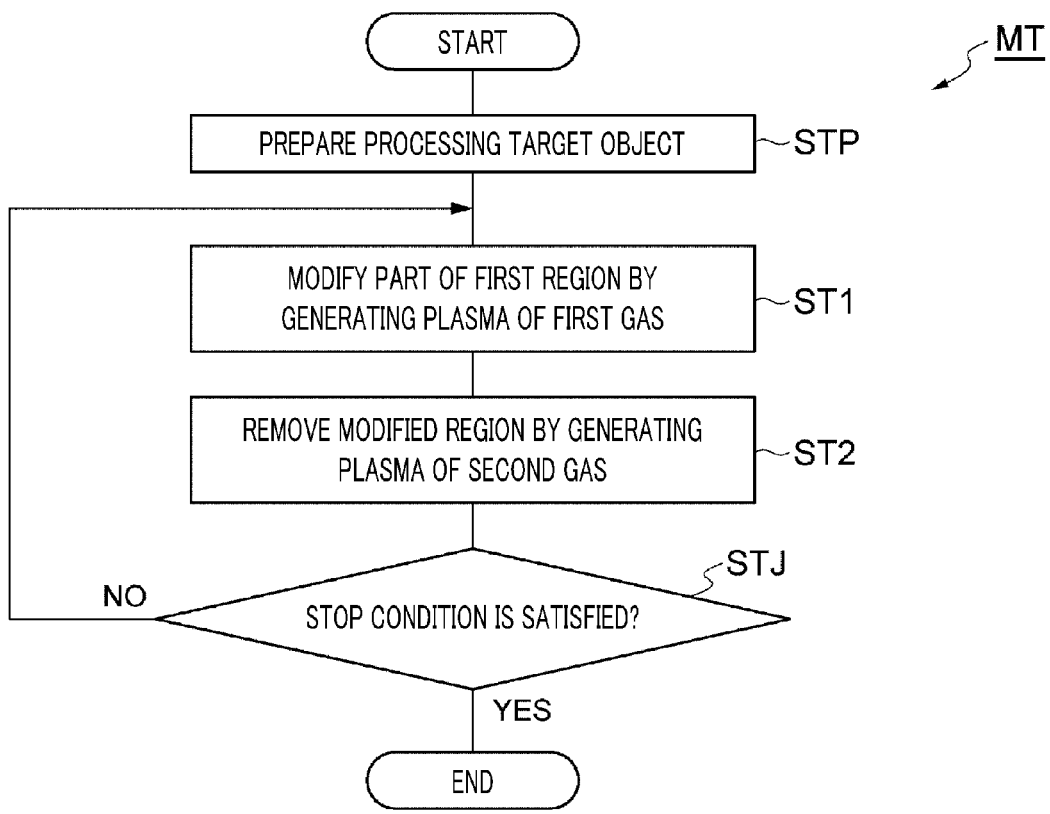
FIG. 1 is a flowchart for describing a method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein Hereinafter, various exemplary embodiments will be described in detail with reference to the accompanying drawings. In the various drawings, same or corresponding parts will be assigned same reference numerals.

FIG. 1 is a flowchart for describing a method according to an exemplary embodiment. A method MT shown in FIG. 1 is a method of etching a first region made of silicon nitride selectively against a second region made of silicon oxide. According to the exemplary embodiment, in the method MT, the first region is selectively etched against the second region and a third region made of silicon. In a process STP of the method MT, a processing target object is prepared within a chamber provided in a chamber main body of a plasma processing apparatus.

Figure 2:
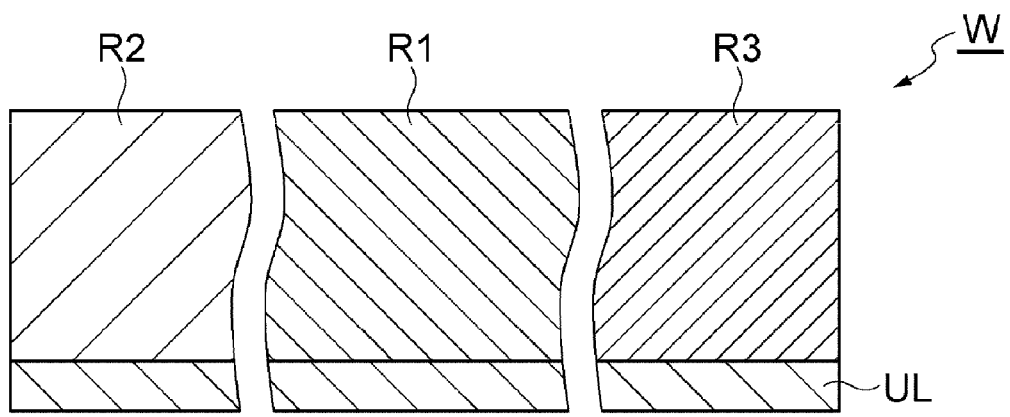
FIG. 2 is an enlarged cross sectional view illustrating a part of an example processing target object to which the method according to the exemplary embodiment is applicable.

FIG. 2 is an enlarged cross sectional view illustrating a part of an example processing target object to which the method according to the exemplary embodiment is applicable. A processing target object W shown in FIG. 2 has a first region R1 and a second region R2. The processing target object W may further have a third region R3. The first region R1 is made of silicon nitride; the second region R2, silicon oxide; and the third region R3, silicon. The third region R3 is made of, by way of example, polycrystalline silicon. In the processing target object W shown in FIG. 2, the first region R1, the second region R2 and the third region R3 are provided on an underlying layer UL. A layout of the first region R1, the second region R2 and the third region R3 of the processing target object W is not limited to the example shown in FIG. 2.

Figure 3:
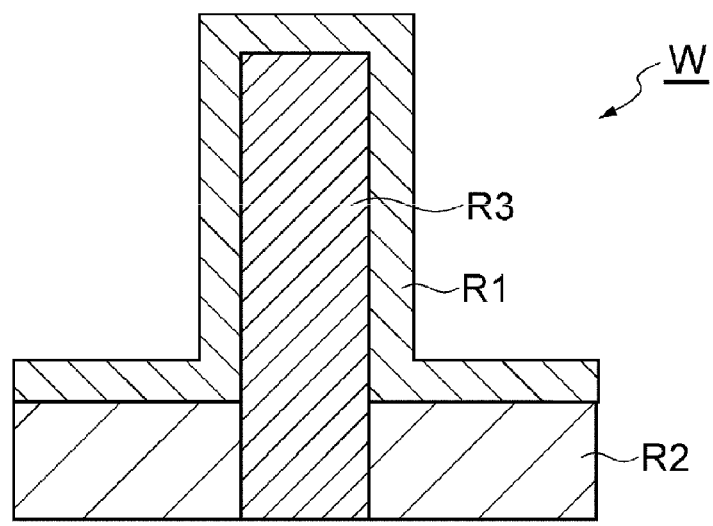
FIG. 3 is an enlarged cross sectional view illustrating a part of another example processing target object to which the method according to the exemplary embodiment is applicable.

FIG. 3 is an enlarged cross sectional view illustrating a part of another example processing target object to which the method according to the exemplary embodiment is applicable. A processing target object W shown in FIG. 3 has, like the processing target object W shown in FIG. 2, a first region R1, a second region R2 and a third region R3. The second region R2 is provided at both sides of the third region R3, and the third region R3 is protruded above the second region R2. The first region R1 is provided to cover the second region R2 and the third region R3. Further, the processing target object W shown in FIG. 3 is an intermediate product obtained in the course of manufacturing a fin type field effect transistor. The third region R3 is used as a fin region which provides a source region, a drain region and a channel region.

Figure 4:
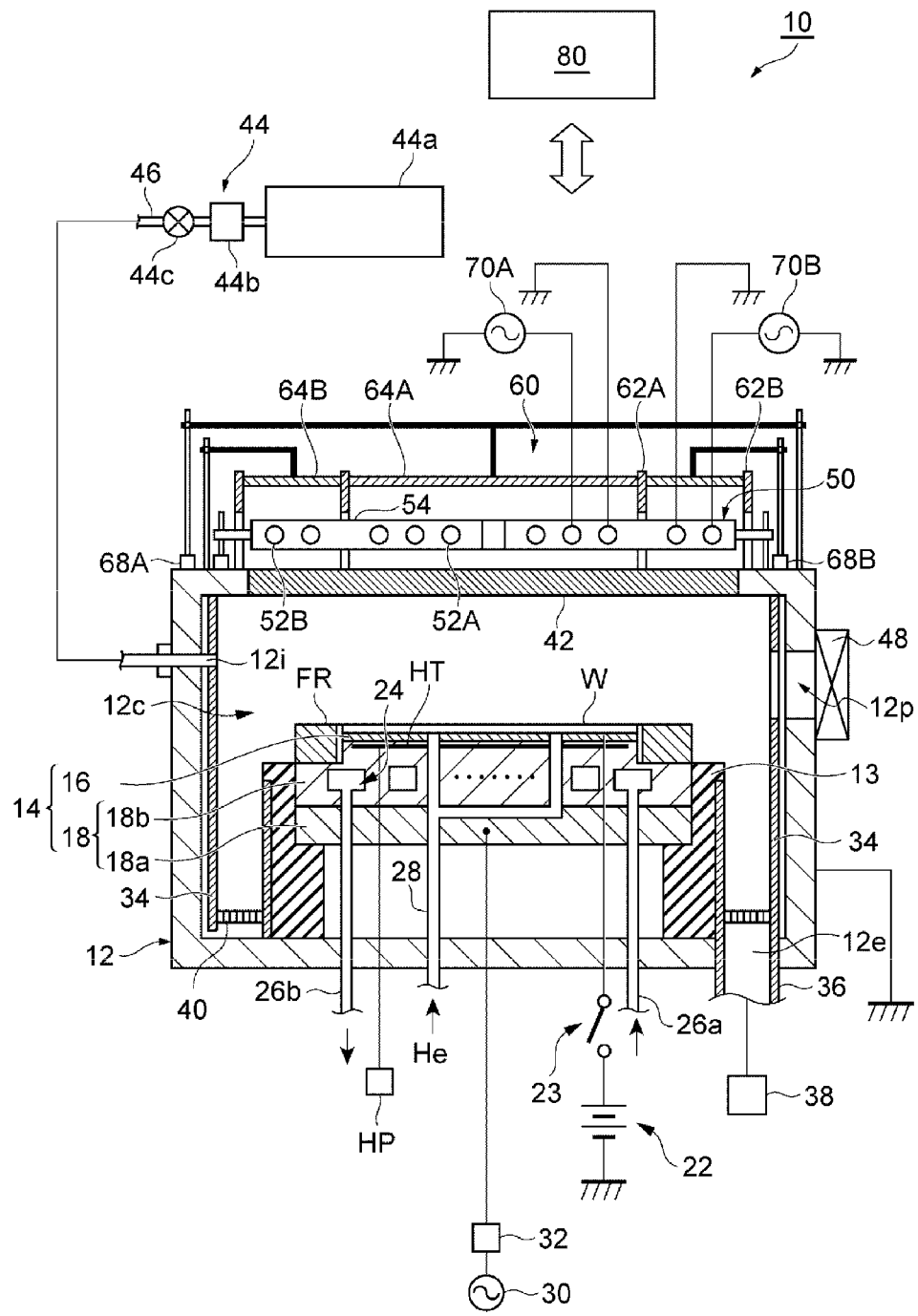
FIG. 4 is a diagram schematically illustrating a plasma processing apparatus in which methods according to various exemplary embodiments are performed.

FIG. 4 is a diagram schematically illustrating a plasma processing apparatus in which methods according to various exemplary embodiments are performed. A plasma processing apparatus 10 shown in FIG. 4 is equipped with an ICP (Inductively Coupled Plasma) type plasma source. The plasma processing apparatus 10 includes a chamber main body 12. The chamber main body 12 is made of a metal such as, but not limited to, aluminum. The chamber main body 12 has, for example, a substantially cylindrical shape. An internal space of the chamber main body 12 is provided as a chamber 12c. The chamber 12c serves as a space for a plasma processing.

A stage 14 is provided at a bottom portion of the chamber main body 12. The stage 14 is configured to hold the processing target object W mounted thereon. The stage 14 is supported by a supporting member 13. In the chamber 12c, the supporting member 13 is extended upwards from the bottom portion of the chamber main body 12. The supporting member 13 may have, for example, a substantially cylindrical shape. The supporting member 13 may be made of an insulating material such as, but not limited to, quartz.

The stage 14 is equipped with an electrostatic chuck 16 and a lower electrode 18. The lower electrode 18 includes a first plate 18a and a second plate 18b. The first plate 18a and the second plate 18b are made of a metal such as, but not limited to, aluminum. The first plate 18a and the second plate 18b may have, for example, a substantially circular plate shape. The second plate 18b is provided on the first plate 18a. The second plate 18b is electrically connected with the first plate 18a.

The electrostatic chuck 16 is provided on the second plate 18b. The electrostatic chuck 16 includes an insulating layer and a film-shaped electrode embedded in the insulating layer. The electrode of the electrostatic chuck 16 is electrically connected to a DC power supply 22 via a switch 23. The electrostatic chuck 16 generates an electrostatic force by a DC voltage applied from the DC power supply 22. The processing target object W is attracted to and held by the electrostatic chuck 16 by the electrostatic force.

In the plasma processing apparatus 10, a focus ring FR is placed on a peripheral portion of the second plate 18b to surround an edge of the processing target object W and an edge of the electrostatic chuck 16. The focus ring FR is configured to improve uniformity of a plasma processing. The focus ring FR is made of, by way of example, but not limitation, quartz.

The second plate 18b is provided with a flow path 24. A heat exchange medium, for example, a coolant is supplied into the flow path 24 from a temperature controller (e.g., a chiller unit) provided outside the chamber main body 12 to adjust a temperature of the stage 14. The temperature controller is a device configured to adjust a temperature of the heat exchange medium. The heat exchange medium is supplied into the flow path 24 from the temperature controller via a pipeline 26a. The heat exchange medium supplied into the flow path 24 is then returned back to the temperature controller via a pipeline 26b. As the heat exchange medium the temperature of which is adjusted by the temperature controller is supplied into the flow path 24 of the stage 14, the temperature of the stage 14 is adjusted and, ultimately, a temperature of the processing target object W is adjusted. In the plasma processing apparatus 10, a gas supply line 28 is extended up to a top surface of the electrostatic chuck 16 through the stage 14. A heat transfer gas such as, but not limited to, a He gas is supplied into a gap between the top surface of the electrostatic chuck 16 and a rear surface of the processing target object W from a heat transfer gas supply device through the gas supply line 28. Accordingly, a heat exchange between the stage 14 and the processing target object W is facilitated.

A heater HT may be provided within the stage 14. The heater HT is a heating element. For example, the heater HT is buried in the second plate 18b or the electrostatic chuck 16. The heater HT is connected to a heater power supply HP. As a power is supplied from the heater power supply HP to the heater HT, the temperature of the stage 14 is adjusted and, ultimately, the temperature of the processing target object W is adjusted.

A high frequency power supply 30 is connected to the lower electrode 18 of the stage 14 via a matching device 32. A high frequency power from the high frequency power supply 30 may be applied to the lower electrode 18. The high frequency power supply 30 is configured to generate a high frequency power for ion attraction into the processing target object W mounted on the stage 14, i.e., a high frequency bias power. By way of example, the high frequency bias power has a frequency in a range from 400 kHz to 40.68 MHz, for example, 13.56 MHz. The matching device 32 has a circuit configured to match an output impedance of the high frequency power supply 30 and an impedance at a load side (lower electrode 18). Further, in the plasma processing apparatus 10, it may be also possible to generate plasma by applying the high frequency bias power to the lower electrode 18 without applying another high frequency power for plasma generation.

In the plasma processing apparatus 10, a shield 34 is provided along an inner wall of the chamber main body 12 in a detachable manner. The shield 34 is also provided on an outer side surface of the supporting member 13. The shield 34 is a member configured to suppress an etching byproduct from adhering to the chamber main body 12. The shield 34 may be formed by coating a surface of an aluminum base member with ceramic such as $Y_2O_3$.

A gas exhaust path is formed between the stage 14 and a sidewall of the chamber main body 12. This gas exhaust path is connected to a gas exhaust port 12e formed at the bottom portion of the chamber main body 12. The gas exhaust port 12e is connected to a gas exhaust device 38 via a pipeline 36. The gas exhaust device 38 includes a pressure controller and a vacuum pump such as a turbo molecular pump. A baffle plate 40 is provided at the gas exhaust path, i.e., between the stage 14 and the sidewall of the chamber main body 12. The baffle plate 40 is provided with a multiple number of through holes in a thickness direction thereof. For example, the baffle plate 40 is formed by coating an aluminum base member with ceramic such as $Y_2O_3$.

A ceiling portion of the chamber main body 12 is opened. This opening is closed by a window member 42. The window member 42 is made of a dielectric material such as quartz. The window member 42 has, for example, a plate shape.

A gas inlet opening 12i is formed at the sidewall of the chamber main body 12. The gas inlet opening 12i is connected to a gas supply unit 44 via a pipeline 46. The gas supply unit 44 is configured to supply a first gas and a second gas to be described later into the chamber 12c. The gas supply unit 44 is equipped with a gas source group 44a, a flow rate controller group 44b and a valve group 44c. The gas source group 44a includes multiple gas sources. These gas sources include sources of one or more gases contained in the first gas and sources of one or more gases contained in the second gas. The flow rate controller group 44b includes multiple flow rate controllers. Each of these flow rate controllers is implemented by a mass flow controller or a pressure control type flow rate controller. The valve group 44c includes multiple valves. Each of the multiple gas sources of the gas source group 44a is connected to the gas inlet opening 12i via the corresponding one of the multiple flow rate controllers of the flow rate controller group 44b and the corresponding one of the multiple valves of the valve group 44c. Further, the gas inlet opening 12i may be formed at a position other than the sidewall of the chamber main body 12, for example, at the window member 42.

An opening 12p is formed at the sidewall of the chamber main body 12. The opening 12p is a passageway through which the processing target object W passes when the processing target object W is carried into the chamber 12c from outside the chamber main body 12 or when the processing target object W is carried out of the chamber main body 12 from the chamber 12c. Further, a gate valve 48 configured to open/close the opening 12p is provided at the sidewall of the chamber main body 12.

An antenna 50 and a shield member 60 are provided above the ceiling portion of the chamber main body 12 and the window member 42. The antenna 50 and the shield member 60 are provided at an outside of the chamber main body 12. In the exemplary embodiment, the antenna 50 includes an inner antenna element 52A and an outer antenna element 52B. The inner antenna element 52A is a spiral coil and is extended above a central portion of the window member 42. The outer antenna element 52B is a spiral coil and is extended above the window member 42 and outside the inner antenna element 52A. Each of the inner antenna element 52A and the outer antenna element 52B is made of a conductor such as, but not limited to, copper, aluminum or stainless steel.

The inner antenna element 52A and the outer antenna element 52B are held and supported by a plurality of supporting body 54. For example, each of the supporting body 54 has a rod shape. These supporting body 54 are extended in a radial shape from a center of the inner antenna element 52A to an outside of the outer antenna element 52B.

The shield member 60 encloses the antenna 50. The shield member 60 has an inner shield wall 62A and an outer shield wall 62B. The inner shield wall 62A has a cylindrical shape and is provided between the inner antenna element 52A and the outer antenna element 52B to surround the inner antenna element 52A. The outer shield wall 62B has a cylindrical shape and is provided at outside the outer antenna element 52B to surround the outer antenna element 52B.

A disk-shaped inner shield plate 64A is placed above the inner antenna element 52A to close an opening of the inner shield wall 62A. An annular plate-shaped outer shield plate 64B is placed above the outer antenna element 52B to close an opening between the inner shield wall 62A and the outer shield wall 62B.

The shapes of the shield walls and the shield plates of the shield member 60 may not be limited to the aforementioned examples. The shape of the shield walls of the shield member 60 may be of another shape such as a rectangular cylindrical shape.

A high frequency power supply 70A is connected to the inner antenna element 52A, and a high frequency power supply 70B is connected to the outer antenna element 52B. High frequency powers having the same or different frequencies are supplied to the inner antenna element 52A and the outer antenna element 52B from the high frequency power supply 70A and the high frequency power supply 70B, respectively. If the high frequency power from the high frequency power supply 70A is supplied to the inner antenna element 52A, an induction field is generated within the chamber 12c, so that a gas within the chamber 12c is excited by the induction field. As a result, plasma is generated above a central region of the processing target object W. Further, if the high frequency power is supplied from the high frequency power supply 70B to the outer antenna element 52B, an induction field is generated within the chamber 12c, so that the gas within the chamber 12c is excited by this induction field. Accordingly, a ring-shaped plasma is generated above a peripheral region of the processing target object W.

Further, electrical lengths of the inner antenna element 52A and the outer antenna element 52B need to be adjusted depending on the high frequency powers respectively output from the high frequency power supplies 70A and 70B. For the purpose, positions of the inner shield plate 64A and the outer shield plate 64B in a height direction are individually adjusted by an actuator 68A and an actuator 68B, respectively.

The plasma processing apparatus 10 may further include a control unit 80. The control unit 80 may be implemented by a computer including a processor, a storage unit such as a memory, an input device, a display device, and so forth. The control unit 80 is operated based on control programs and recipe data stored in the storage unit to control various components of the plasma processing apparatus 10. To elaborate, the control unit 80 controls various components of the plasma processing apparatus 10 such as the multiple flow rate controllers of the flow rate controller group 44b, the multiple valves of the valve group 44c, the gas exhaust device 38, the high frequency power supply 70A, the high frequency power supply 70B, the high frequency power supply 30, the matching device 32, the heater power supply HP, and so forth. Furthermore, when performing methods according to various exemplary embodiments, the control unit 80 may control the various components of the plasma processing apparatus 10 based on control programs and recipe data.

Figure 5A:
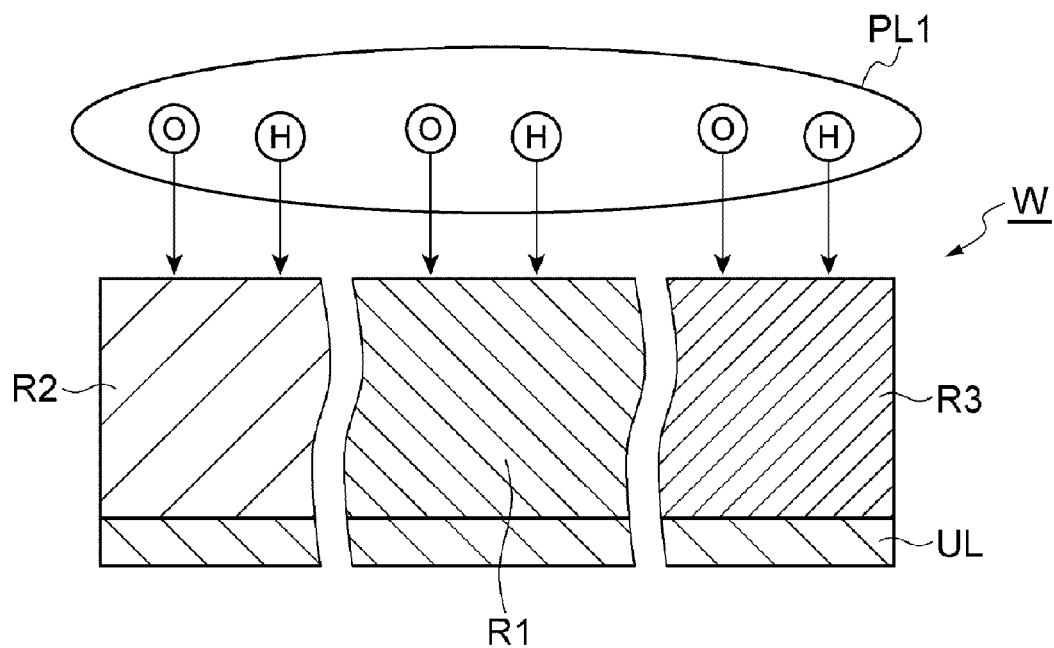
FIG. 5A is a diagram for describing a process ST1 of the method according to the exemplary embodiment and FIG. 5B is a diagram illustrating a state of the processing target object after the process ST1 of the method according to the exemplary embodiment is performed.
Figure 5B:
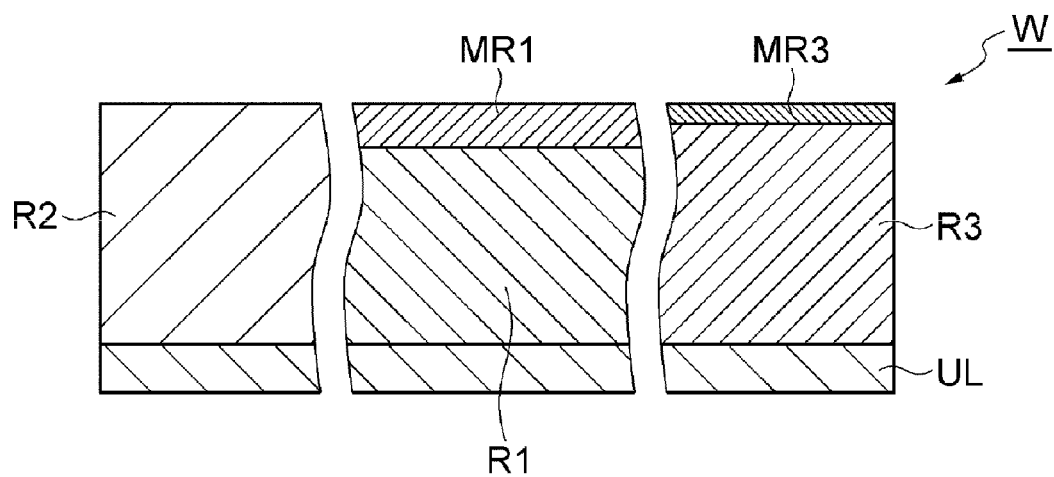
Figure 6A:
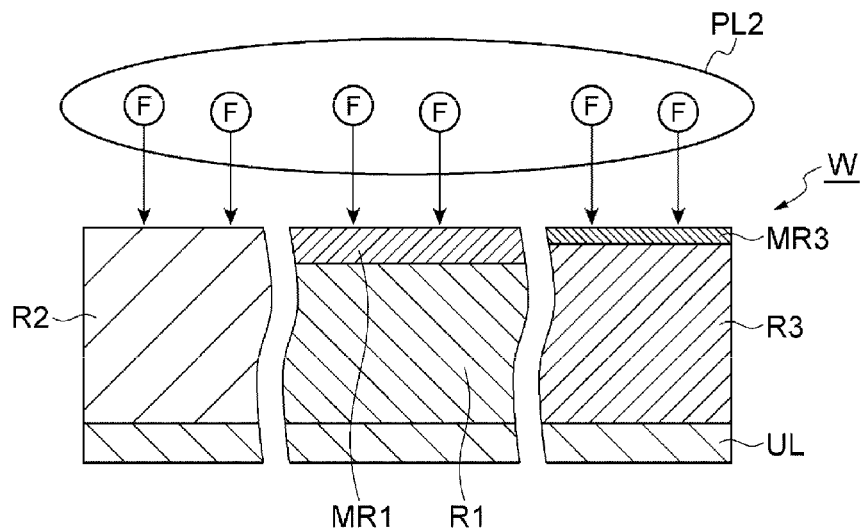
FIG. 6A is a diagram for describing a process ST2 of the method according to the exemplary embodiment.
Figure 6B:
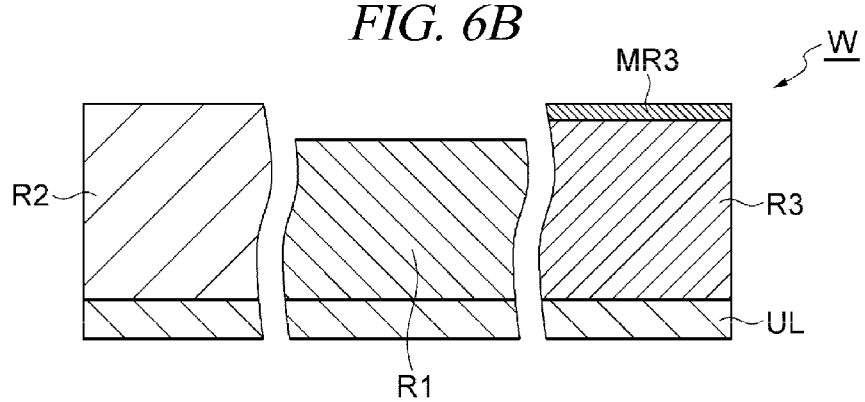
FIG. 6B is a diagram illustrating a state of the processing target object after the process ST2 of the method according to the exemplary embodiment is performed.
Figure 6C:
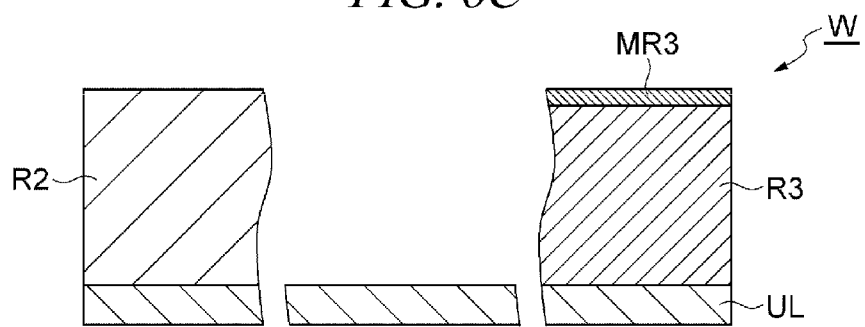
FIG. 6C is a diagram illustrating a state of the processing target object upon the completion of the method according to the exemplary embodiment.
Figure 7A:
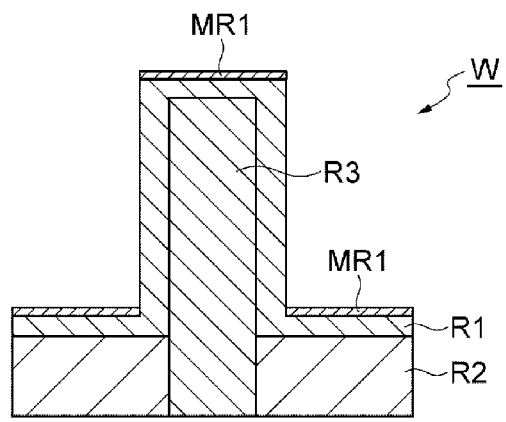
FIG. 7A is a diagram illustrating a state of the processing target object after the process ST1 of the method according to the exemplary embodiment is performed.
Figure 7B:
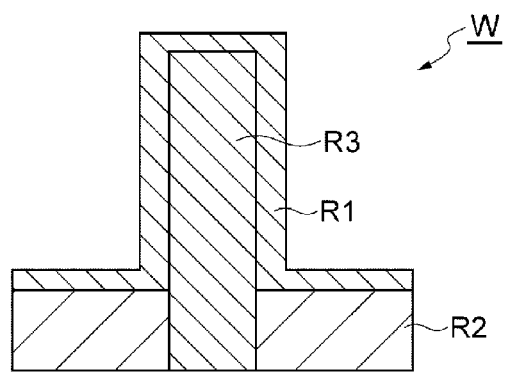
FIG. 7B is a diagram illustrating a state of the processing target object after the process ST2 of the method according to the exemplary embodiment is performed.
Figure 7C:
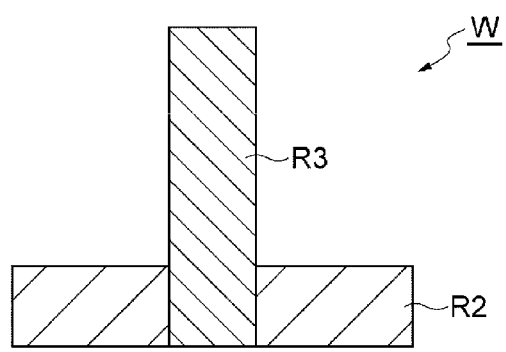
FIG. 7C is a diagram illustrating a state of the processing target object upon the completion of the method according to the exemplary embodiment.

Now, referring back to FIG. 1, the method MT will be explained in detail. Further, in the following description, reference is made to FIG. 5A, FIG. 5B, FIG. 6A, FIG. 6B, FIG. 6C, FIG. 7A, FIG. 7B and FIG. 7C. FIG. 5A is a diagram for describing a process ST1 of the method according to the exemplary embodiment, and FIG. 5B is a diagram illustrating a state of a processing target object after the process ST1 of the method according to the exemplary embodiment is performed. FIG. 6A is a diagram for describing a process ST2 of the method according to the exemplary embodiment; FIG. 6B is a diagram illustrating a state of the processing target object after the process ST2 of the method according to the exemplary embodiment is performed; and FIG. 6C is a diagram illustrating a state of the processing target object after the method according to the exemplary embodiment is completed. FIG. 7A is a diagram illustrating a state of the processing target object after the process ST1 of the method according to the exemplary embodiment is performed; FIG. 7B is a diagram illustrating a state of the processing target object after the process ST2 of the method according to the exemplary embodiment is performed; and FIG. 7C is a diagram illustrating a state of the processing target object after the method according to the exemplary embodiment is completed.

As depicted in FIG. 1, in the process STP of the method MT, the processing target object W shown in FIG. 2 or FIG. 3 is prepared within a chamber provided by a chamber main body of a plasma processing apparatus. The processing target object W is placed on a stage having a lower electrode. In case of using the plasma processing apparatus 10, the processing target object W is placed on the stage 14 and held by the electrostatic chuck 16.

In the method MT, the process ST1 and the process ST2 are performed in sequence in the state that the processing target object W is placed on the stage 14. In the process ST1, plasma PL1 of a first gas is generated within the chamber. The first gas includes a hydrogen-containing gas (a gas containing hydrogen). The hydrogen-containing gas may be, by way of non-limiting example, a $H_2$ gas and/or a $NH_3$ gas.

In the process ST1, active species of hydrogen, for example, hydrogen ions are irradiated from the plasma PL1 to a surface of the processing target object W, as illustrated in FIG. 5A. In FIG. 5A, each circular figure surrounding a letter "H" represents the active species of the hydrogen. If the actives species of the hydrogen are irradiated to the surface of the processing target object W, a part of the first region R1, that is, a part of the first region R1 including a surface thereof is modified and becomes a modified region MR1, as depicted in FIG. 5B. In case that the processing target object W is as shown in FIG. 3, the modified region MR1 is formed as shown in FIG. 7A. The modified region MR1 is easily removable by active species of fluorine. Meanwhile, a second region R2 is stabilized and is not modified by the active species of the hydrogen.

In the process ST1 according to the exemplary embodiment, the high frequency bias power is supplied to the lower electrode of the stage. In the process ST1, the plasma may be generated only by the high frequency bias power. If the high frequency bias power is supplied to the lower electrode, the hydrogen ions are strongly attracted into the processing target object W, so that the modification of the first region R1 is accelerated and a thickness of the modified region MR1 in a thickness direction of the first region R1 is increased. Further, a power level of the high frequency bias power supplied to the lower electrode in the process ST1 is set such that etching by sputtering does not take place.

In case that the processing target object W has the third region R3, the first gas may further include an oxygen-containing gas (a gas containing oxygen). By way of non-limiting example, the oxygen-containing gas may be one of an $O_2$ gas, a CO gas, a $CO_2$ gas, a NO gas, a $NO_2$ gas, a $N_2O$ gas and a $SO_2$ gas or a mixed gas containing two or more of these gases. In case that the first gas includes the oxygen-containing gas, active species of oxygen, for example, oxygen ions are irradiated to the surface of the processing target object W, as illustrated in FIG. 5A. In FIG. 5A, each circular figure surrounding a letter "O" represents the active species of the oxygen. If the actives species of the oxygen are irradiated to the surface of the processing target object W, a part of the third region R3, that is, a part of the third region R3 including a surface thereof is oxidized and becomes an oxidized region MR3, as depicted in FIG. 5B. Once the surface of the third region R3 is oxidized, etching of the third region R3 is suppressed in the process ST2 to be described later.

In the exemplary embodiment, a flow rate ratio of the oxygen-containing gas in the first gas to the hydrogen-containing gas in the first gas may range from $3/100$ to $9/100$. By setting the flow rate ratio of the oxygen-containing gas in the first gas to the hydrogen-containing gas in the first gas to be in this range, the etching of the third region R3 including the oxidized region MR3 is further suppressed in the process ST2 to be described later. Furthermore, a reduction of an etching rate of the first region R1 is also suppressed in the second process ST2.

In the plasma processing apparatus 10, the first gas including the hydrogen-containing gas is supplied into the chamber 12c from the gas supply unit 44 in the process ST1. The first gas supplied into the chamber 12c may further include the oxygen-containing gas. A flow rate of each of the one or more gases included in the first gas is controlled by the corresponding one of the flow rate controllers of the flow rate controller group 44b. Furthermore, a pressure of the chamber 12c is set to a preset pressure by the gas exhaust device 38. Besides, the high frequency bias power may be supplied to the lower electrode 18 from the high frequency power supply 30. In the process ST1, though the high frequency powers may also be respectively supplied to the inner antenna element 52A and the outer antenna element 52B from the high frequency power supply 70A and the high frequency power supply 70B to generate the plasma, the supply of these high frequency powers to the antenna elements 52A and 52B is just optional. That is, in the process ST1, the plasma may be generated just by supplying the high frequency bias power to the lower electrode 18, without applying any additional high frequency power.

In the subsequent process ST2, plasma PL2 of a second gas may be generated within the chamber. The second gas includes a fluorine-containing gas (a gas containing fluorine). The fluorine-containing gas may be any of various gases containing fluorine. By way of non-limiting example, the fluorine-containing gas may be one of a $NF_3$ gas, a $SF_6$ gas and a fluorocarbon gas (e.g., a $CF_4$ gas) or a mixed gas containing one or more of these gases. In addition to the fluorine-containing gas, the second gas may further include other gases such as, but not limited to, an $O_2$ gas and a rare gas such as an Ar gas.

In the process ST2, as depicted in FIG. 6A, the active species of the fluorine are irradiated to the surface of the processing target object W from the plasma PL2. In FIG. 6A, each circular figure surrounding a letter "F" represents the active species of the fluorine. If the actives species of the fluorine are irradiated to the surface of the processing target object W, the modified region MR1 is selectively etched and removed by the active species of the fluorine, as depicted in FIG. 6B. Further, as for the processing target object W as shown in FIG. 3, the modified region MR1 is removed, as depicted in FIG. 7B.

In the process ST2 according to the exemplary embodiment, the high frequency bias power is not supplied to the lower electrode of the stage. If the high frequency bias power is not supplied to the lower electrode in the process ST2, the etching is performed mainly by fluorine radicals, not fluorine ions, as the active species of the fluorine. That is, not a sputter etching by ions but an etching by the radicals progresses. Accordingly, the etching of the second region R2 and the third region R3 including the oxidized region MR3 is suppressed. Further, the modified region MR1 is removed by a chemical reaction between the modified region MR1 and the active species of the fluorine.

In the process ST2 according to the exemplary embodiment, the second gas may further contain hydrogen. In case that the second gas contains the hydrogen, a ratio of a number of hydrogen atoms in the second gas to a number of fluorine atoms in the second gas is set to be equal to or higher than ⅝. Further, in case that the fluorine-containing gas is a $NF_3$ gas and the hydrogen-containing gas is a $H_2$ gas in the second gas, a flow rate ratio of the $H_2$ gas in the second gas to the $NF_3$ gas in the second gas is equal to or higher than ¾. If the ratio of the number of the hydrogen atoms in the second gas to the number of the fluorine atoms in the second gas or the flow rate ratio of the $H_2$ gas in the second gas to the $NF_3$ gas in the second gas is set as stated above, silicon nitride, oxygen nitride and silicon are hardly etched. Silicon nitride modified by hydrogen, however, is etched. That is, the modified region MR1 is etched. Thus, etching selectivity for the first region R1 is further improved.

In the plasma processing apparatus 10, in the process ST2, the second gas including the fluorine-containing gas is supplied into the chamber 12c from the gas supply unit 44. The second gas supplied into the chamber 12c may further include the hydrogen-containing gas. A flow rate of each of the one or more gases included in the second gas is controlled by the corresponding one of the flow rate controllers of the flow rate controller group 44b. Further, the pressure of the chamber 12c is set to a preset pressure by the gas exhaust device 38. Besides, the high frequency power is supplied to the inner antenna element 52A from the high frequency power supply 70A, and the high frequency power is supplied to the outer antenna element 52B from the high frequency power supply 70B. The high frequency bias power from the high frequency power supply 30 may not be supplied to the lower electrode 18 or, if supplied, the power level thereof is relatively low.

As shown in FIG. 1, in a subsequent process STJ, it is determined whether a stop condition is satisfied. It is determined that the stop condition is satisfied when a repetition number of a sequence including the process ST1 and the process ST2 reaches a preset number. In the process STJ, if it is determined that the stop condition is not satisfied, the process ST1 is performed again. Meanwhile, if it is determined that the stop condition is satisfied, the method MT is ended. By the time the method MT is completed, the first region R1 is removed from the processing target object W shown in FIG. 2, as can be seen from FIG. 6C. Alternatively, the first region R1 is removed from the processing target object W shown in FIG. 3, as depicted in FIG. 7C.

In the method MT, the part of the first region R1 is modified by the active species of the hydrogen generated in the process ST1 and becomes the modified region MR1 which can be easily removed by the active species of the fluorine. Meanwhile, since the second region R2 made of silicon oxide is stabilized, the second region R2 is not modified by the active species of the hydrogen. Accordingly, in the process ST2, the modified region MR1 is removed selectively against the second region R2. Therefore, according to the method MT, the first region R1 is selectively etched against the second region R2. Furthermore, the active species in the plasma generated in the process ST1 and the process ST2 have a very low deposition property as compared to active species of plasma of a hydrofluorocarbon gas, or has substantially no deposition property. Thus, according to the method MT, generation of a deposit is suppressed.

Moreover, if the processing target object W has the third region R3, the first gas includes the oxygen-containing gas as stated above. Accordingly, the surface of the third region R3 is oxidized by the active species of the oxygen in the process ST1, and the etching of the third region R3 including the oxidized region MR3 is suppressed in the etching of the process ST2. Accordingly, the first region R1 is selectively etched against the second region R2 and the third region R3.

Figure 8:
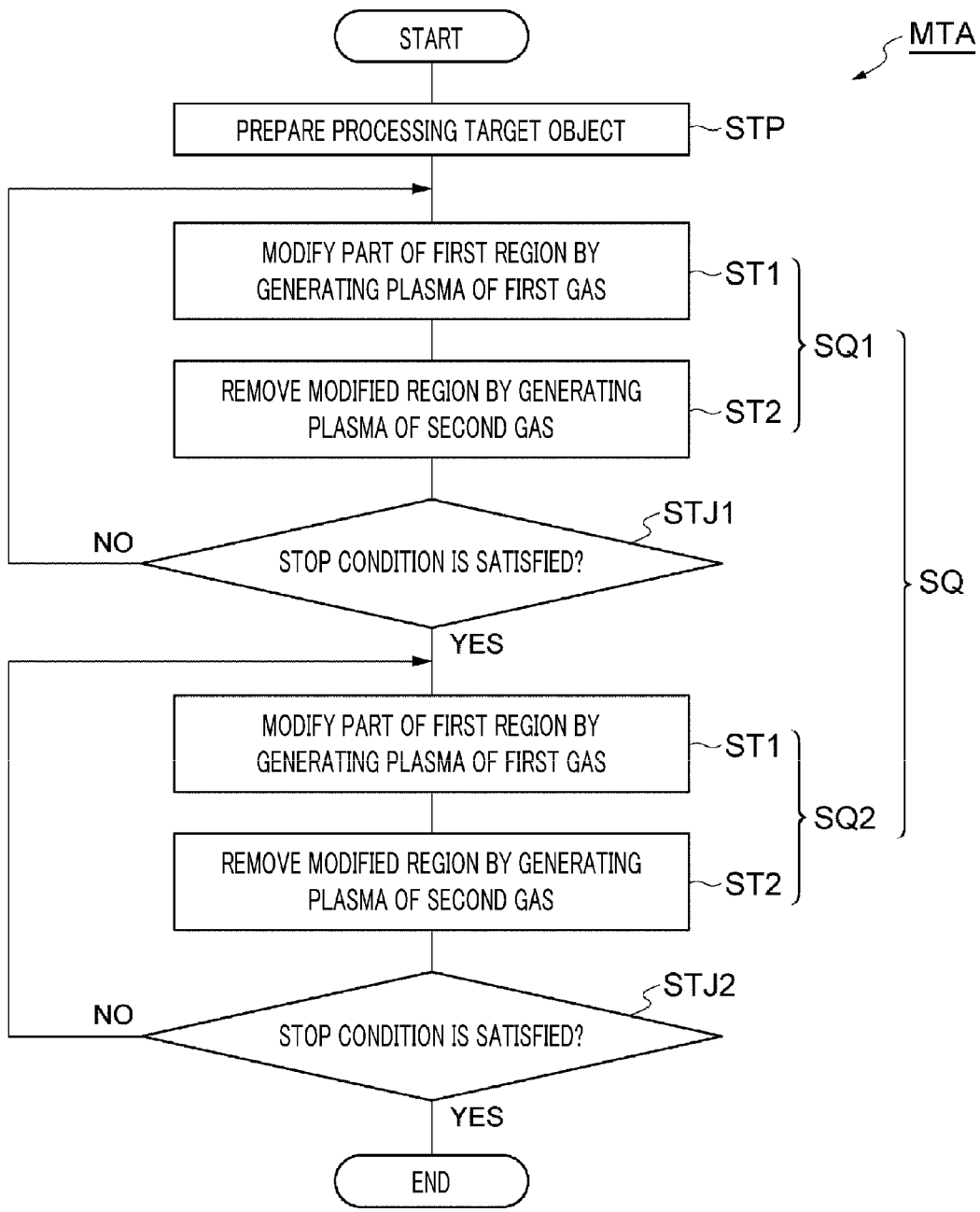
FIG. 8 is a flowchart for describing a method according to another exemplary embodiment.

Furthermore, in the exemplary embodiment as described above, the flow rate ratio of the oxygen-containing gas in the first gas to the hydrogen-containing gas in the first gas is set to be in a range from 3/100 to 9/100. In the exemplary embodiment, the etching of the third region R3 including the oxidized region MR3 is further suppressed in the process ST2. Further, the reduction of the etching rate of the first region R1 in the process ST2 is suppressed. As a consequence, the first region R1 can be selectively etched against the third region R3 with a higher selectivity Now, a method according to another exemplary embodiment will be explained. FIG. 8 is a flowchart for describing the method according to this exemplary embodiment. A method MTA shown in FIG. 8 is applicable to a processing target object in which a second region R2 and a third region R3 are covered with a first region R1, like the processing target object W as shown in FIG. 3.

The method MTA includes a process STP which is the same as the process STP of the method MT. The method MTA further includes multiple sequences SQ which are performed in order. Each of the multiple sequences SQ includes a process ST1 which is the same as the process ST1 of the method MT and a process ST2 which is the same as the process ST2 of the method MT.

The multiple sequences SQ include one or more first sequences SQ1 and one or more second sequences SQ2. The one or more first sequences SQ1 are one or more sequences including a sequence which is performed first among the multiple sequences. The one or more second sequences SQ2 are sequences performed after the one or more first sequences SQ1 among the multiple sequences SQ. The one or more second sequences SQ2 include a process ST1 for oxidizing the surface of the third region R3.

The method MTA includes a process STJ1 and a process STJ2. In the process STJ1, it is determined whether a stop condition is satisfied. In the process STJ1, it is determined that the stop condition is satisfied when a repetition number of the first sequence SQ1 reaches a preset number. If it is determined in the process STJ1 that the stop condition is not satisfied, the first sequence SQ1 is performed again. Meanwhile, if it is determined in the process STJ1 that the stop condition is satisfied, the processing progresses to the second sequence SQ2.

In the process STJ2, it is determined whether a stop condition is satisfied. In the process STJ2, it is determined that the stop condition is satisfied when a repetition number of the second sequence SQ2 reaches a preset number. If it is determined in the process STJ2 that the stop condition is not satisfied, the second sequence SQ2 is performed again. Meanwhile, if it is determined in the process STJ2 that the stop condition is satisfied, the method MTA is ended.

Figure 9A:
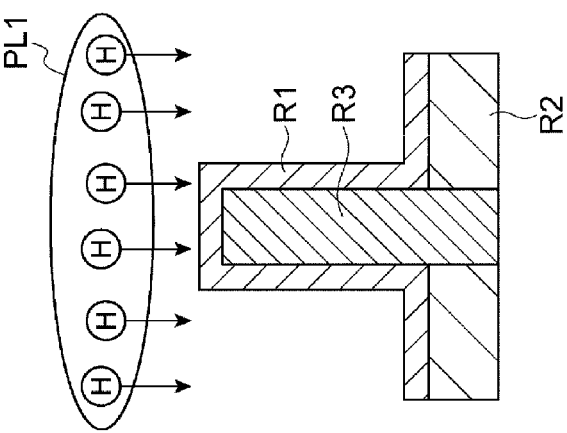
FIG. 9A and FIG. 9B are diagrams for respectively describing a process ST1 of a first sequence and a process ST1 of a second sequence in a first example of the method shown in FIG. 8.
Figure 9B:
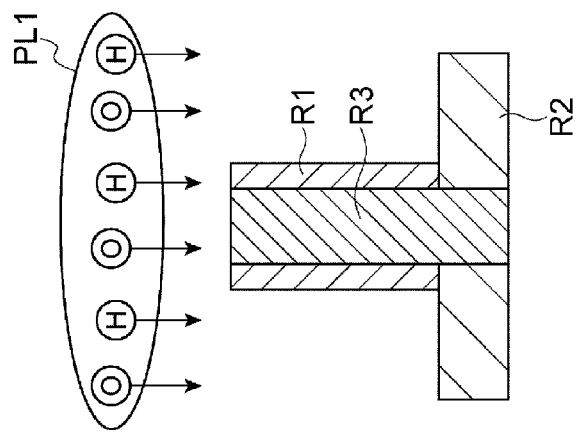
Figure 9C:
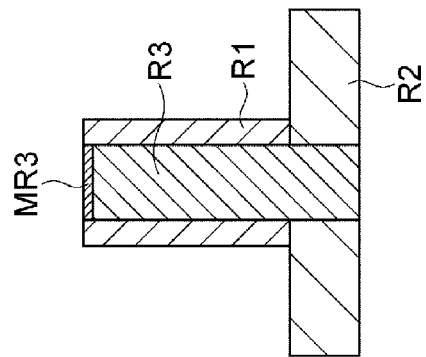
FIG. 9C is a diagram illustrating a state where a surface of a third region is oxidized as a result of performing the process ST1 of the second sequence.

FIG. 9A and FIG. 9B are diagrams for describing the process ST1 of the first sequence and the process ST1 of the second sequence in a first example of the method shown in FIG. 8. FIG. 9C is a diagram illustrating a state in which the surface of the third region is oxidized by the process ST1 of the second sequence. In the first example of the method MTA, the one or more first sequences SQ1 are performed until the third region R3 is exposed. In the first example of the method MTA, a first gas used in the process ST1 of the one or more first sequences SQ1 does not include an oxygen-containing gas. Accordingly, as depicted in FIG. 9A, in the process ST1 of the one or more first sequences SQ1, active species of oxygen are not irradiated to a processing target object W, and active species of hydrogen are irradiated to the processing target object W.

In the first example of the method MTA, the one or more second sequences SQ2 are performed immediately after the third region R3 is exposed. In the process ST1 of the one or more second sequences SQ2, a first gas includes an oxygen-containing gas in addition to a hydrogen-containing gas. Accordingly, in the first example of the method MTA, the active species of the hydrogen and the active species of the oxygen are irradiated to the processing target object W in the process ST1 immediately after the third region R3 is exposed, as shown in FIG. 9B. Consequently, as depicted in FIG. 9C, immediately after the surface of the third region R3 is exposed, the surface of the third region R3 is oxidized, and an oxidized region MR3 is formed. Thus, the third region R3 is protected from being etched by active species of fluorine in the process ST2. According to the first example of this method MTA, the first region R1 is selectively etched against the second region R2 and the third region R3.

Figure 10A:
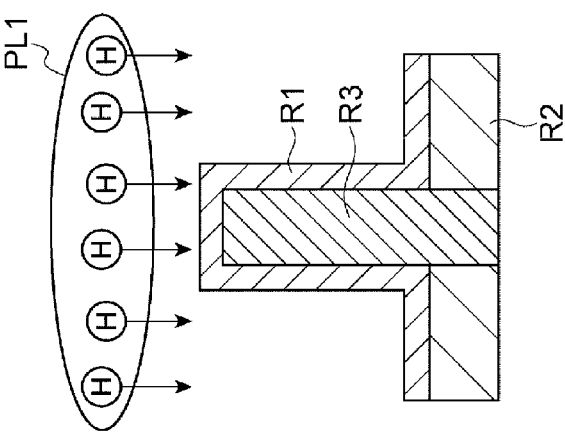
FIG. 10A and FIG. 10B are diagrams for respectively describing a process ST1 of a first sequence and a process ST1 of a second sequence in a second example of the method shown in FIG. 8.
Figure 10B:
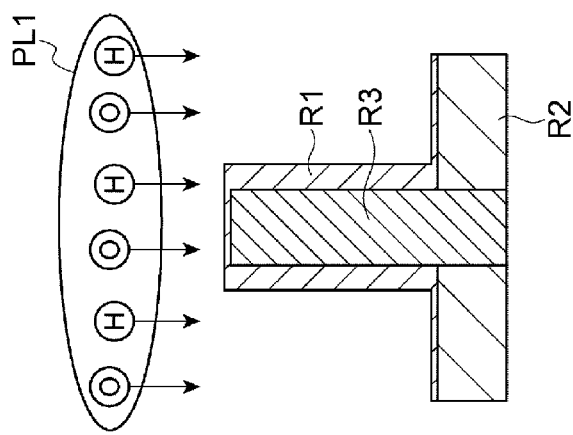
Figure 10C:
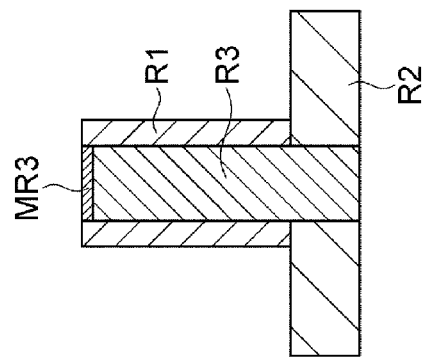
FIG. 10C is a diagram illustrating a state where the surface of the third region is oxidized as a result of performing the process ST1 of the second sequence.

FIG. 10A and FIG. 10B are diagrams for describing the process ST1 of the first sequence and the process ST1 of the second sequence in a second example of the method shown in FIG. 8. FIG. 10C is a diagram illustrating a state in which the surface of the third region is oxidized by the process ST1 of the second sequence. In the second example of the method MTA, the one or more first sequences SQ1 are performed until a time immediately before the third region R3 is exposed. That is, the one or more first sequences SQ1 are performed until there is created a state in which the first region R1 is slightly left to cover the third region R3. In the second example of the method MTA, a first gas used in the process ST1 of the one or more first sequences SQ1 does not include an oxygen-containing gas. Accordingly, as depicted in FIG. 10A, in the process ST1 of the one or more first sequences SQ1, active species of oxygen are not irradiated to a processing target object W, and active species of hydrogen are irradiated to the processing target object W.

In the one or more second sequences SQ2 of the second example of the method MTA, a first gas includes an oxygen-containing gas in addition to a hydrogen-containing gas. Accordingly, in the second example of the method MTA, the active species of the oxygen are irradiated to the processing target object W after the time immediately before the third region R3 is exposed, as shown in FIG. 10B. Accordingly, as depicted in FIG. 10C, the surface of the third region R3 is oxidized immediately after the surface of the third region R3 is exposed. Thus, after a time immediately after the surface of the third region R3 is exposed, the third region R3 is protected from being etched by active species of fluorine in the process ST2. According to the second example of this method MTA, the first region R1 is selectively etched against the second region R2 and the third region R3.

Figure 11:
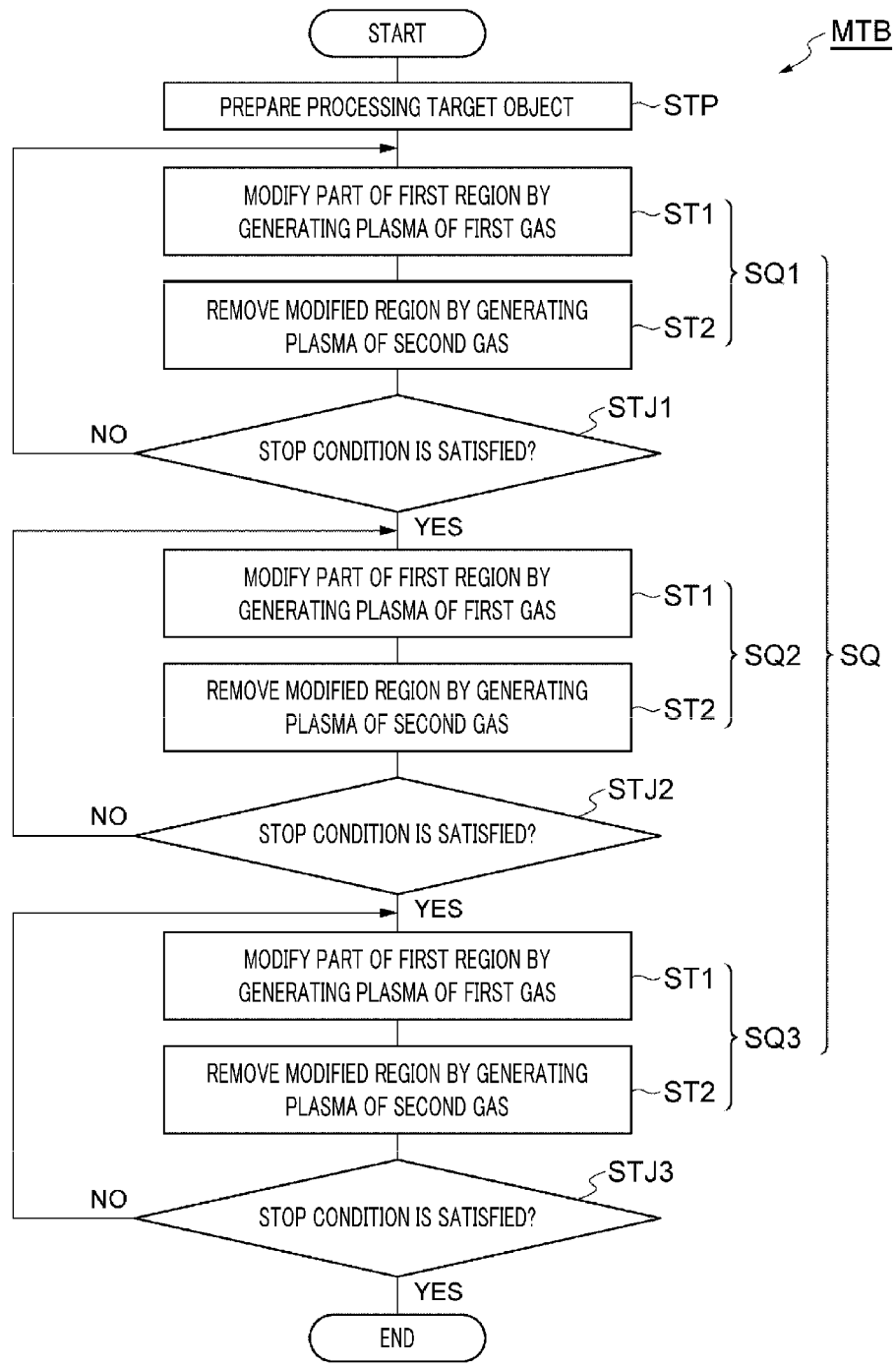
FIG. 11 is a flowchart for describing a method according to still another exemplary embodiment.

Now, a method according to still another exemplary embodiment will be discussed. FIG. 11 is a flowchart for describing the method according to this exemplary embodiment. A method MTB shown in FIG. 11 is applicable to a processing target object in which a second region R2 and a third region R3 are covered with a first region R1, like the processing target object W as shown in FIG. 3, like the method MTA. The method MTB further includes one or more third sequences SQ3 and a process STJ3 in addition to a process STP, one or more first sequences SQ1, a process STJ1, one or more second sequences SQ2 and a process STJ2.

In the method MTB, the one or more second sequences SQ2 are ended after a surface of the third region R3 is oxidized. In the method MTB, if it is determined in the process STJ2 that a stop condition is satisfied, the processing progresses to the third sequence SQ3. In the process STJ3, it is determined whether a stop condition is satisfied. It is determined that the stop condition is satisfied when a repetition number of the third sequence SQ3 reaches a preset number. If it is determined in the process STJ3 that the stop condition is not satisfied, the third sequence SQ3 is performed again. Meanwhile, if it is determined in the process STJ3 that the stop condition is satisfied, the method MTB is ended.

FIG. 12A, FIG. 12B and FIG. 12C are diagrams for describing a process ST1 of the first sequence, a process ST1 of the second sequence and a process ST1 of the third sequence in the method shown in FIG. 11, respectively. In the method MTB, the one or more first sequences SQ1 are performed until a time immediately before the third region R3 is exposed or until the third region R3 is exposed. In the process ST1 of the one or more first sequences SQ1, a first gas does not include an oxygen-containing gas. Accordingly, as shown in FIG. 12A, in the process ST1 of the one or more first sequences SQ1, active species of oxygen are not irradiated to the processing target object W, and active species of hydrogen are irradiated to the processing target object W. Further, in the process ST1 of the one or more first sequences SQ1, the first gas may include an oxygen-containing gas.

In the method MTB, the one or more second sequences SQ2 are performed to oxidize a surface of the third region R3 after the one or more first sequences SQ1. In the process ST1 of the one or more second sequences SQ2, a first gas has an oxygen-containing gas in addition to a hydrogen-containing gas. Thus, according to the one or more second sequences SQ2 of the method MTB, active species of oxygen are irradiated to the processing target object W immediately after the third region R3 is exposed, as depicted in FIG. 12B. In the method MTB, the one or more second sequences SQ2 are ended after the surface of the third region R3 is oxidized.

In the method MTB, the one or more third sequences SQ3 are performed after the one or more second sequences SQ2. In the process ST1 of the one or more third sequences SQ3, a first gas does not include an oxygen-containing gas. Accordingly, as shown in FIG. 12C, in the process ST1 of the one or more third sequences SQ3, active species of oxygen are not irradiated to the processing target object W and active species of hydrogen are irradiated to the processing target object W. In the method MTB, since the surface of the third region R3 is oxidized immediately after the third region R3 is exposed in the one or more second sequences SQ2, the third region R3 is protected from being etched by active species of fluorine in a process ST2 even if the first gas does not include an oxygen-containing gas in the process ST1 of the one or more third sequences SQ3. According to this method MTB, the first region R1 is selectively etched against the second region R2 and the third region R3.

Now, results of various experiments will be explained. However, the present disclosure is not limited thereto.

(First Experiment)

A first experiment is conducted to find a condition under which the silicon nitride is not etched by the active species from the plasma of the second gas when the silicon nitride is not modified by the active species of the hydrogen. In the first experiment, a silicon nitride film, a silicon oxide film and a silicon film are processed by the plasma of the second gas within the chamber of the plasma processing apparatus 10. The second gas used in the first experiment contains a $NF_3$ gas, a $H_2$ gas, an $O_2$ gas and an Ar gas. In the first experiment, the flow rate of the $H_2$ gas in the second gas is set to various values. Below, other parameters in the first experiment are specified.

Figure 13A:
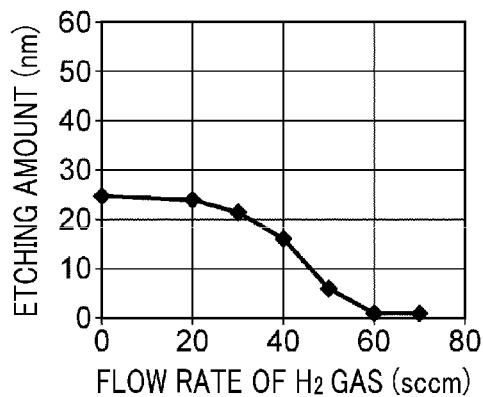
FIG. 13A to FIG. 13C are graphs showing a result of a first experiment.
Figure 13B:
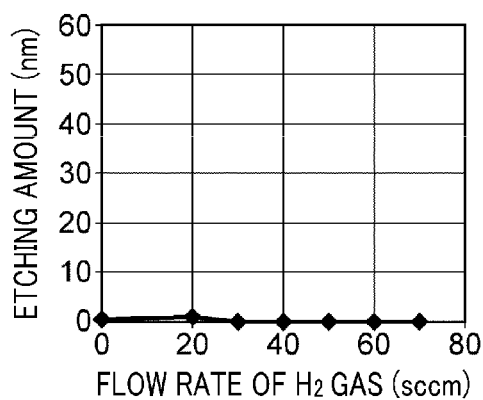
Figure 13C:
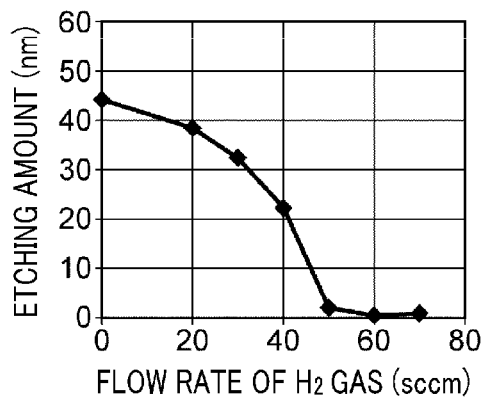

<Parameters of the First Experiment>
Pressure of chamber 12c: 400 mTorr (53.33 Pa)
High frequency power of high frequency power supplies 70A and 70B: 27 MHz, 600 W
High frequency bias power: 0 W
Flow rate of $NF_3$ gas: 45 sccm
Flow rate of $O_2$ gas: 300 sccm
Flow rate of Ar gas: 100 sccm
Processing time: 10 sec In the first experiment, film thickness decrements (lengths), that is, etching amounts of the silicon nitride film, the silicon oxide film and the silicon film by the processing with the plasma of the second gas are respectively measured. FIG. 13A, FIG. 13B and FIG. 13C are graphs showing results of the first experiment. In each of the graphs of FIG. 13A to FIG. 13C, a horizontal axis represents a flow rate of the $H_2$ gas in the second gas. A vertical axis of the graph in FIG. 13A indicates the etching amount of the silicon nitride film; a vertical axis of the graph in FIG. 13B, the etching amount of the silicon oxide film; and a vertical axis of the graph in FIG. 13C, the etching amount of the silicon film.

As can be seen from FIG. 13A, FIG. 13B and FIG. 13C, if the flow rate of the $H_2$ gas in the second gas is equal to or higher than 60 sccm, the silicon nitride film, the silicon oxide film and the silicon film are substantially hardly etched in the processing with the plasma of the second gas. Accordingly, it is found out that the silicon nitride, the silicon oxide and the silicon are not etched in the processing with the plasma of the second gas in which the flow rate ratio of the $H_2$ gas in the second gas to the $NF_3$ gas in the second gas is equal to or higher than 3/4. From this point of fact, it is confirmed that if the ratio of the number of hydrogen atoms in the second gas to the number of fluorine atoms in the second gas is equal to or higher than 8/9, the silicon nitride, the silicon oxide and the silicon are not etched in the processing with the plasma of the second gas.

(Second Experiment)

In a second experiment, the method MT is applied to a silicon nitride film, a silicon oxide film and a silicon film by using the plasma processing apparatus 10, and a relationship between a flow rate ratio of the $O_2$ gas in the first gas to the $H_2$ gas in the first gas and an etching selectivity of the silicon nitride film against the silicon oxide film and the silicon film is obtained. In the second experiment, a sequence including the process ST1 and the process ST2 is repeated 6 times. Other parameters of the second experiment are as follows.

Figure 14A:
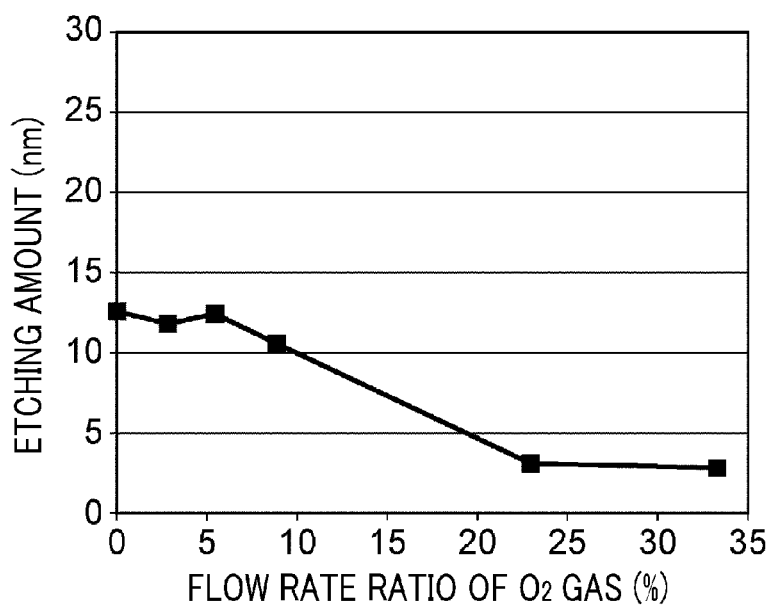
FIG. 14A and FIG. 14B are graphs showing a result of a second experiment.
Figure 14B:
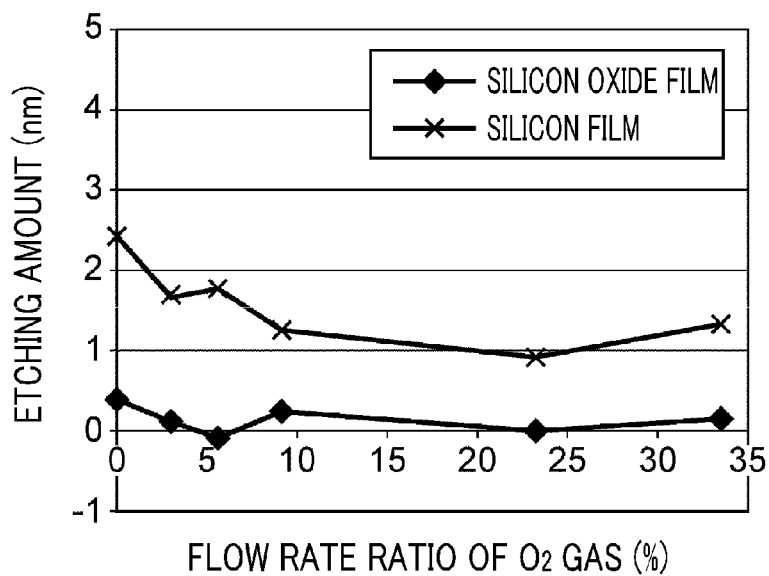
Figure 15:
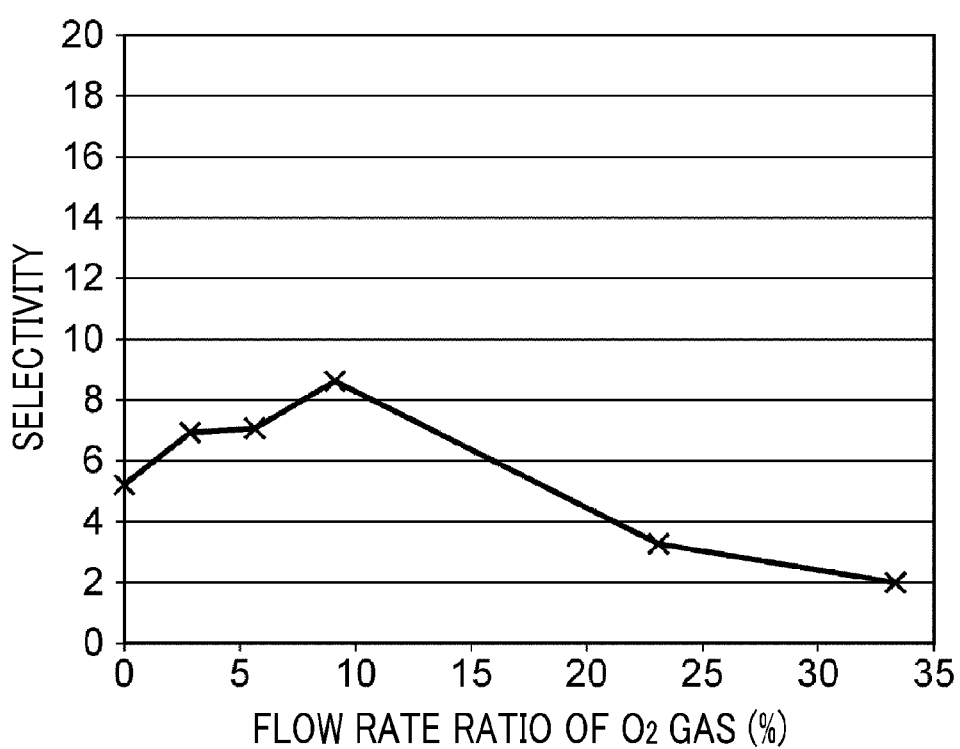
FIG. 15 is a graph showing a result of the second experiment.

<Parameters of the Process ST1 in the Second Experiment>
Pressure of chamber 12c: 30 mTorr (4 Pa)
High frequency power of high frequency power supplies 70A and 70B: 0 W
High frequency bias power: 13.56 MHz, 50 W
Flow rate of $H_2$ gas: 100 sccm
Processing time: 15 sec <Parameters of the Process ST2 in the Second Experiment>
Pressure of chamber 12c: 400 mTorr (53.33 Pa)
High frequency power of high frequency power supplies 70A and 70B: 27 MHz, 600 W
High frequency bias power: 0 W
Flow rate of $NF_3$ gas: 45 sccm
Flow rate of $H_2$ gas: 60 sccm
Flow rate of $O_2$ gas: 300 sccm
Flow rate of Ar gas: 100 sccm
Processing time: 10 sec In the second experiment, film thickness decrements (lengths), that is, etching amounts of the silicon nitride film, the silicon oxide film and the silicon film are respectively measured. Further, the ratio of the etching amount of the silicon nitride film to the etching amount of the silicon film, that is, the etching selectivity of the silicon nitride film against the silicon film is calculated based on the etching amounts of the silicon nitride film and the silicon film. FIG. 14A, FIG. 14B and FIG. 15 show results thereof. In each of graphs in FIG. 14A, FIG. 14B and FIG. 15, a horizontal axis represents a flow rate ratio of the $O_2$ gas to the $H_2$ gas. A vertical axis of the graph in FIG. 14A indicates the etching amount of the silicon nitride film; a vertical axis of the graph in FIG. 14B, the etching amount of the silicon oxide film and the etching amount of the silicon film; and a vertical axis of the graph in FIG. 15, the etching selectivity of the silicon nitride film against the silicon film.

As can be seen from FIG. 14B, if the flow rate ratio of the $O_2$ gas in the first gas to the $H_2$ gas in the first gas is equal to or higher than 3/100 (i.e., a percentage of 3%), the etching amount of the silicon film is found to be decreased, that is, the etching of the silicon film is found to be suppressed. Further, as can be seen from FIG. 14A, if the flow rate ratio of the $O_2$ gas in the first gas to the $H_2$ gas in the first gas is equal to or less than 9/100 (i.e., a percentage of 9%), the etching amount of the silicon nitride film is found to be almost equal to the etching amount of the silicon nitride film obtained when the flow rate ratio of the $O_2$ gas in the first gas to the $H_2$ gas in the first gas is zero (0). That is, in case that the flow rate ratio of the $O_2$ gas in the first gas to the $H_2$ gas in the first gas is equal to or less than 9/100, the etching amount of the silicon nitride film does not substantially decline. Accordingly, as shown in FIG. 15, it is found out that the high etching selectivity of the silicon nitride film against the silicon film can be obtained if the flow rate ratio of the $O_2$ gas in the first gas to the $H_2$ gas in the first gas is set to be in a range from 3/100 to 9/100.

(Third Experiment)

In a third experiment, the method MT is applied to an experiment sample 1 and an experiment sample 2, which are the same as the processing target object W shown in FIG. 3, by using the plasma processing apparatus 10. In the method MT applied to the experiment sample 1, the first gas does not contain an $O_2$ gas. Meanwhile, in the method MT applied to the experiment sample 2, the first gas contains an $O_2$ gas. Further, a plasma processing using a processing gas containing a hydrofluorocarbon gas is performed on a comparative sample, which is the same as the processing target object W shown in FIG. 3, by using the plasma processing apparatus 10. Below, parameters of the method MT applied to the experiment sample 1, parameters of the method MT applied to the experiment sample 2 and parameters of the plasma processing applied to the comparative sample are specified. In addition, in the method MT applied to the experiment sample 1 and the method MT applied to the experiment sample 2, the processing is performed until the first region R1 is completed removed, and the sequence including the process ST1 and the process ST2 is repeated thirty three (33) times. Likewise, in the plasma processing upon the comparative example, the processing is conducted until the first region R1 is completed removed.

Figures 16A, 16B:
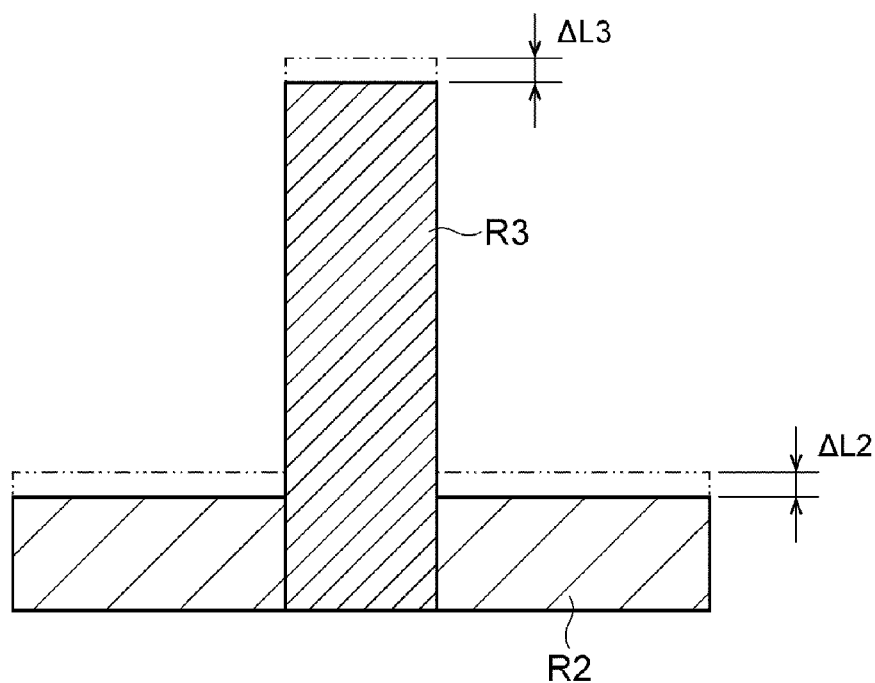
FIG. 16A is a diagram for describing a decrement obtained for each sample in a third experiment and FIG. 16B is a table showing the decrement obtained for each sample in the third experiment.

<Parameters of the Process ST1 in the Method MT for the Experiment Sample 1 in the Third Experiment>
  Pressure of chamber 12c: 30 mTorr (4 Pa)
  High frequency power of high frequency power supplies 70A and 70B: 0 W
  High frequency bias power: 13.56 MHz, 50 W
  Flow rate of $H_2$ gas: 100 sccm
  Flow rate of $O_2$ gas: 0 sccm
  Processing time: 15 sec <Parameters of the Process ST2 in the Method MT for the Experiment Sample 1 in the Third Experiment>
  Pressure of chamber 12c: 400 mTorr (53.33 Pa)
  High frequency power of high frequency power supplies 70A and 70B: 27 MHz, 600 W
  High frequency bias power: 0 W
  Flow rate of $NF_3$ gas: 45 sccm
  Flow rate of $H_2$ gas: 60 sccm
  Flow rate of $O_2$ gas: 300 sccm
  Flow rate of Ar gas: 100 sccm
  Processing time: 10 sec <Parameters of the Process ST1 in the Method MT for the Experiment Sample 2 in the Third Experiment>
  Pressure of chamber 12c: 30 mTorr (4 Pa)
  High frequency power of high frequency power supplies 70A and 70B: 0 W
  High frequency bias power: 13.56 MHz, 50 W
  Flow rate of $H_2$ gas: 100 sccm
  Flow rate of $O_2$ gas: 9 sccm
  Processing time: 15 sec <Parameters of the Process ST2 in the Method MT for the Experiment Sample 2 in the Third Experiment>
  Pressure of chamber 12c: 400 mTorr (53.33 Pa)
  High frequency power of high frequency power supplies 70A and 70B: 27 MHz, 600 W
  High frequency bias power: 0 W
  Flow rate of $NF_3$ gas: 45 sccm
  Flow rate of $H_2$ gas: 60 sccm
  Flow rate of $O_2$ gas: 300 sccm
  Flow rate of Ar gas: 100 sccm
  Processing time: 10 sec <Parameters of the Plasma Processing Upon the Comparative Sample>
  Pressure of chamber 12c: 50 mTorr (6.666 Pa)
  High frequency power of high frequency power supplies 70A and 70B: 27 MHz, 200 W
  High frequency bias power: 50 W
  Flow rate of $CH_3F$ gas: 30 sccm
  Flow rate of $O_2$ gas: 15 sccm
  Flow rate of He gas: 500 sccm FIG. 16A is a diagram for describing a decrement measured for each of the samples in the third experiment. In FIG. 16A, the second region R2 and the third region R3 of each sample before the processing are indicated by dashed double-dotted lines, and the second region R2 and the third region R3 of each sample after the processing are indicated by solid lines. In the third experiment, as shown in FIG. 16A, a decrement $\Delta L2$ of the second region R2 and a decrement $\Delta L3$ of the third region R3 are obtained for each sample. Results are shown in a table of FIG. 16B. As can be seen from a result of the comparative sample shown in the table of FIG. 16B, not only the first region R1 but also the second region R2 and the third region R3 are etched in the plasma processing with the processing gas containing the hydrofluorocarbon gas. Meanwhile, as can be seen from a result of the experiment sample 1 shown in the table of FIG. 16B, in the method MT, it is found out that the first region R1 can be etched selectively without etching the second region R2 through the modification with the plasma of the first gas including the hydrogen-containing gas. In the method MT applied to the experiment sample 1, however, since the first gas does not include the oxygen-containing gas, the third region R3 is etched. In case of the experiment sample 2 to which the method MT with the first gas including the oxygen-containing gas, it is found out that the first region R1 can be etched selectively while etching neither the second region R2 nor the third region R3.

Figure 17:
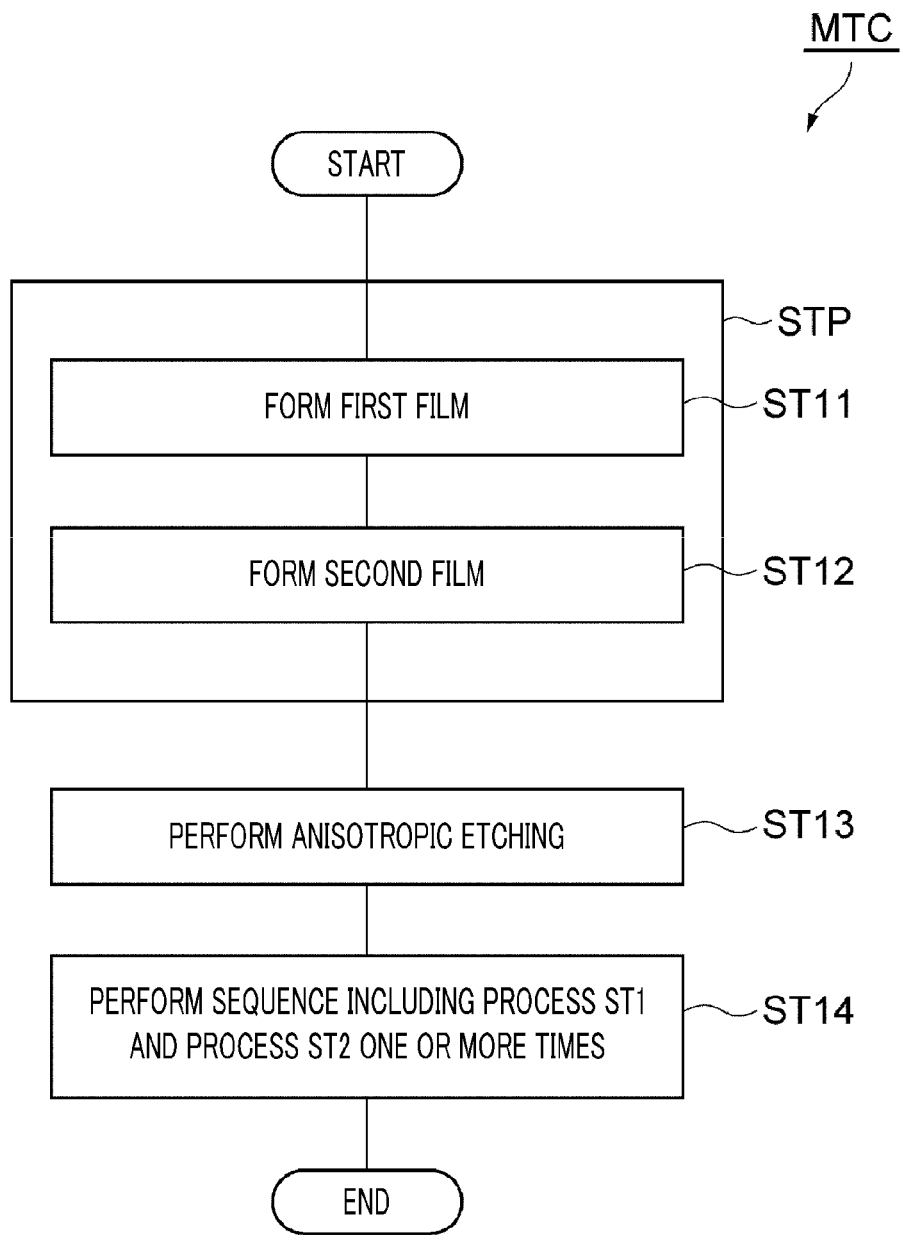
FIG. 17 is a flowchart for describing a method according to still yet another exemplary embodiment.

Now, a method according to still yet another exemplary embodiment will be discussed. FIG. 17 is a flowchart for describing the method according to this exemplary embodiment. In the following description, reference is made to FIG. 18 to FIG. 25B together with FIG. 17. In a method MTC shown in FIG. 17, a sequence including the process ST1 and the process ST2 as stated above is performed one or more times after a second region is formed on a processing target object having a first region. Hereinafter, though the description is provided for the method MTC performed by using the plasma processing apparatus 10, the method MTC can be performed by using a plasma processing apparatus other than the plasma processing apparatus 10.

Figure 18:
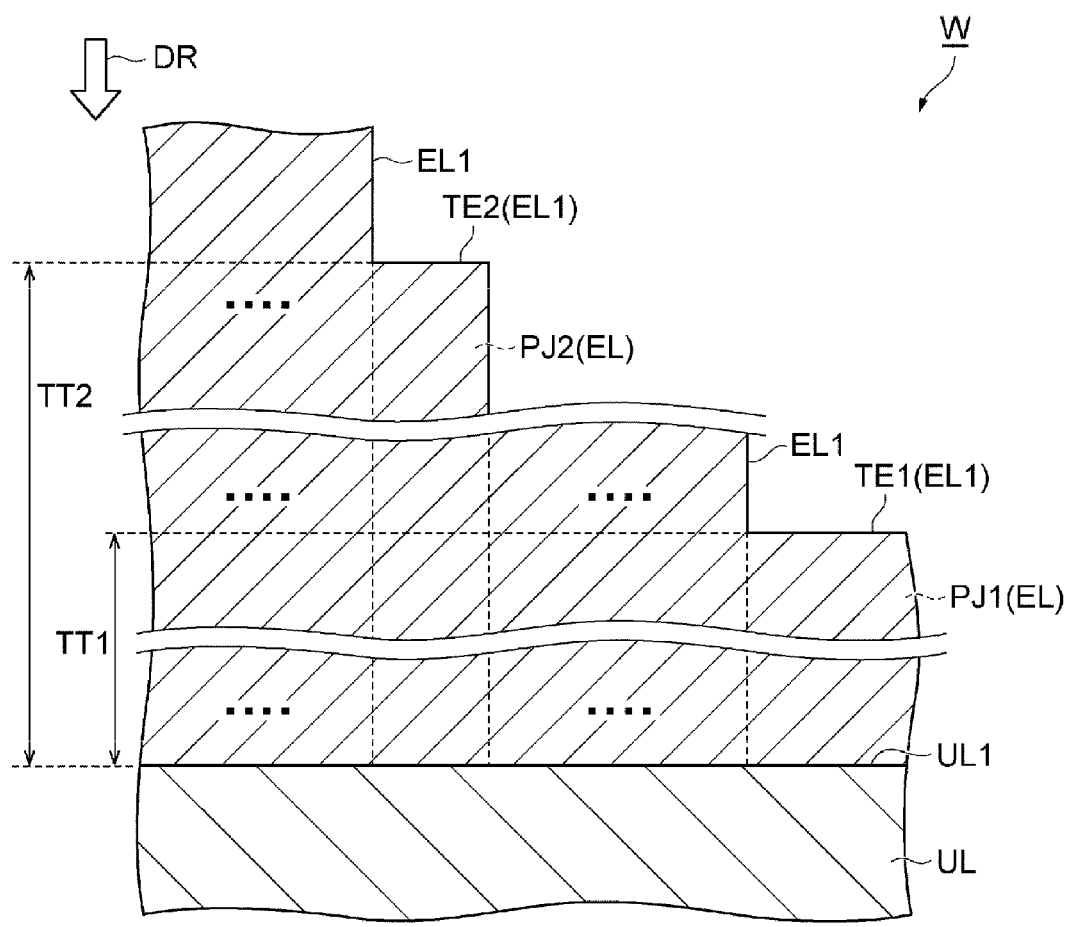
FIG. 18 is an enlarged cross sectional view illustrating a part of a processing target object to which the method of FIG. 17 is applied.

In a process STP of the method MTC, a processing target object W shown in FIG. 18 is placed on the stage 14 of the plasma processing apparatus 10. The processing target object W shown in FIG. 18 has an underlying layer UL and a region EL. The region EL is provided on the underlying layer UL. A surface of the underlying layer UL includes a main surface UL1. The main surface UL1 is perpendicular to a direction DR. The direction DR corresponds to the vertical direction in a state that the processing target object W is placed on the stage 14 (on the electrostatic chuck 16).

The region EL has a plurality of protruded regions (e.g., a protruded region PJ1, a protruded region PJ2, etc.). Each of the plurality of protruded regions of the region EL is extended upwards from the main surface UL1. Each of the plurality of protruded regions of the region EL has an end surface. The protruded region PJ1 has an end surface TE1. The protruded region PJ2 has an end surface TE2. On the processing target object W shown in FIG. 18, the end surface of each of the plurality of protruded regions of the region EL is exposed. That is, the end surface TE1 of the protruded region PJ1 is exposed, and the end surface TE2 of the protruded region PJ2 is exposed.

A height of each of the plurality of protruded regions is equivalent to a distance between the end surface thereof and the main surface UL1. A height TT1 of the protruded region PJ1 is a distance between the end surface TE1 and the main surface UL1. A height TT2 of the protruded region PJ2 is a distance between the end surface TE2 and the main surface UL1. The heights of the plurality of protruded regions of the region EL are different from each other. The protruded region PJ1 is lower than the protruded region PJ2. That is, a value of the height TT1 of the protruded region PJ1 is smaller than a value of the height TT2 of the protruded region PJ2.

The underlying layer UL is made of, by way of non-limiting example, Si (silicon). The region EL is made of, by way of example, but not limitation, silicon nitride. That is, the entire region EL may be the first region made of silicon nitride. Alternatively, the plurality of protruded regions may be made of different materials. For example, a part of the plurality of protruded regions may be made of a material different from a material of the other protruded regions. By way of non-limiting example, the protruded region PJ1 may be made of silicon nitride, whereas the other region(s) may be made of one or more other materials such as silicon. In such a case, the protruded region PJ1 is the first region made of silicon nitride.

End portions (portions including the end surface TE1, the end surface TE2, etc.) of the plurality of protruded regions (the protruded region PJ1, the protruded region PJ2, etc.) of the region EL may be formed such that widths thereof are narrowed depending on a distance from the main surface UL1. That is, the end portions of the plurality of protruded regions of the region EL may have a tapered shape. In case that the end portions of the plurality of protruded regions of the region EL have the tapered shape, widths of openings confined by the end portions of the plurality of protruded regions are relatively large. Thus, the formation of the deposit at the end portions of the protruded regions can be sufficiently suppressed.

Figure 24:
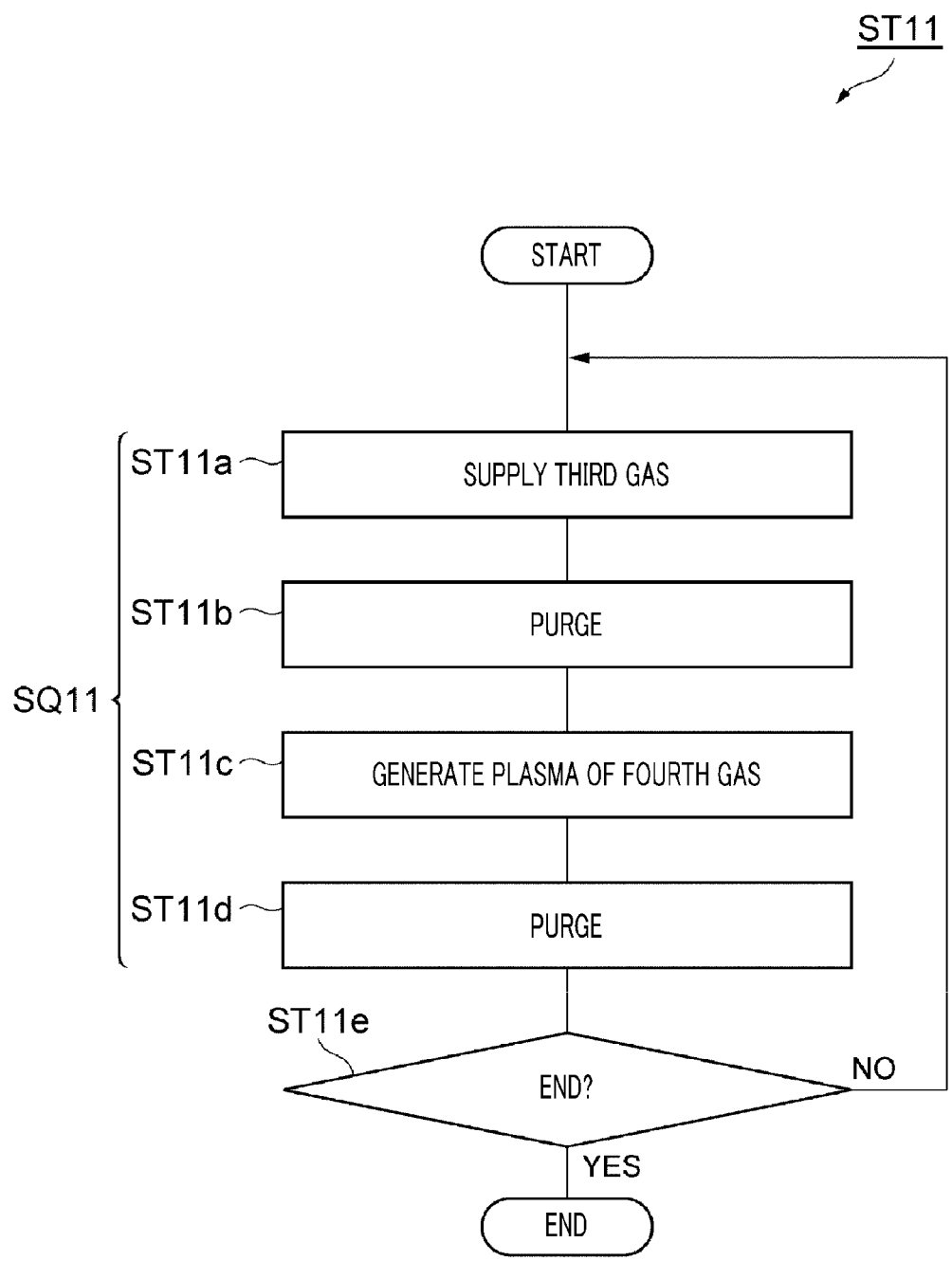
FIG. 24 is a flowchart for describing a part of processes of the method shown in FIG. 17 in detail.

As depicted in FIG. 17, the process STP includes a process ST11 and a process ST12. In the process ST11, in the state that the processing target object W shown in FIG. 18 is placed on the stage 14, a first film SF1 is conformally formed on a surface of the processing target object W. The first film SF1 is made of silicon oxide. A film forming method of the process ST11 is an ALD (Atomic Layer Deposition) method. FIG. 24 is a detailed flowchart of the process ST11. As shown in FIG. 24, the process ST11 includes a process ST11a, a process ST11b, a process ST11c and a process ST11d. The process ST11a, the process ST11b, the process ST11c and the process ST11d constitute a sequence SQ11. In the process ST11, the sequence SQ11 is performed one or more times.

In the process ST11a, a third gas is supplied from the gas supply unit 44 into the chamber 12c in which the processing target object W is accommodated. The third gas includes aminosilane-based gas, by way of non-limiting example, an organic-containing aminosilane-based gas. By way of example, monoaminosilane ($H_3$—Si—R (R denotes an organic-containing amino group)) may be used as the organic-containing aminosilane-based gas. In the process ST11a, plasma of the third gas is not generated. In the process ST11a, molecules (e.g., monoaminosilane) in the third gas adhere to a surface of the processing target object W as a precursor. Further, the aminosilane-based gas included in the third gas may contain, besides the monoaminosilane, aminosilane having one to three silicon atoms. Furthermore, the aminosilane-based gas included in the third gas may contain aminosilane having one to three amino groups.

In the subsequent process ST11b, the chamber 12c is purged. That is, in the process ST11b, the third gas is exhausted. In the process ST11b, an inert gas such as a nitrogen gas or a rare gas may be supplied into the chamber 12c as a purge gas. In the process ST11b, molecules excessively adhering on the processing target object W may be removed. By performing the process ST11b, a layer of the precursor on the processing target object W becomes a very thin layer (e.g., a monomolecular layer).

In the process ST11c, plasma of a fourth gas is generated within the chamber 12c. The fourth gas includes a gas containing oxygen atoms. The fourth gas may include, for example, an oxygen gas. In the process ST11c, the fourth gas is supplied into the chamber 12c from the gas supply unit 44. Further, the pressure of the chamber 12c is set to a predetermined pressure by the gas exhaust device 38. Further, the high frequency powers are respectively supplied to the inner antenna element 52A and the outer antenna element 52B from the high frequency power supply 70A and the high frequency power supply 70B. Further, the high frequency bias power may be supplied to the lower electrode 18 from the high frequency power supply 30. In the process ST11c, the fourth gas is excited into the plasma. The layer of the precursor is exposed to active species of the oxygen from the plasma. As a result, the layer of the precursor becomes a silicon oxide film (the first film SF1 or a part thereof).

In the subsequent process ST11d, the chamber 12c is purged. That is, in the process ST11d, the fourth gas is exhausted. In the process ST11d, an inert gas such as a nitrogen gas or a rare gas may be supplied into the chamber 12c as a purge gas.

Figure 19:
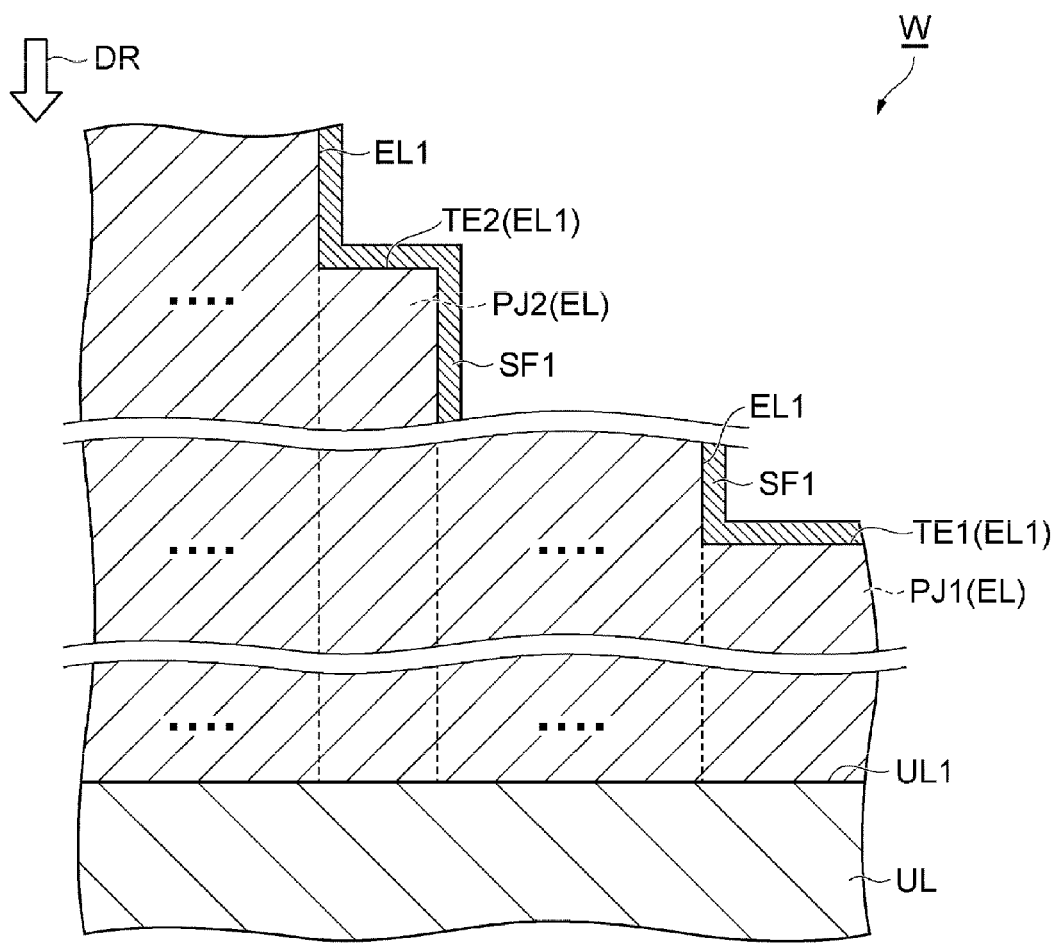
FIG. 19 is a cross sectional view illustrating a state of the part of the processing target object in the middle of performing the method of FIG. 17.

In a subsequent process ST11e, it is determined whether the sequence SQ11 is to be ended. To elaborate, in the process ST11e, it is determined whether a repetition number of the sequence SQ11 has reached a preset number. If it is determined in the process ST11e that the repetition number of the sequence SQ11 has not reach the preset number, the sequence SQ11 is performed again. Meanwhile, if it is determined in the process ST11e that the repetition number of the sequence SQ11 has reached the preset number, the process ST11 is ended. As a result of performing the process ST11, the first film SF1 is conformally formed on the surface of the processing target object W, as illustrated in FIG. 19. A thickness of the first film SF1 is defined by the repetition number of the sequence SQ11. That is, the thickness of the first film SF1 is expressed as the product of a thickness of the silicon oxide film formed by performing the sequence SQ11 a single time and the repetition number of the sequence SQ11. The repetition number of the sequence SQ11 is set based on a required thickness of the first film SF1.

Figure 20:
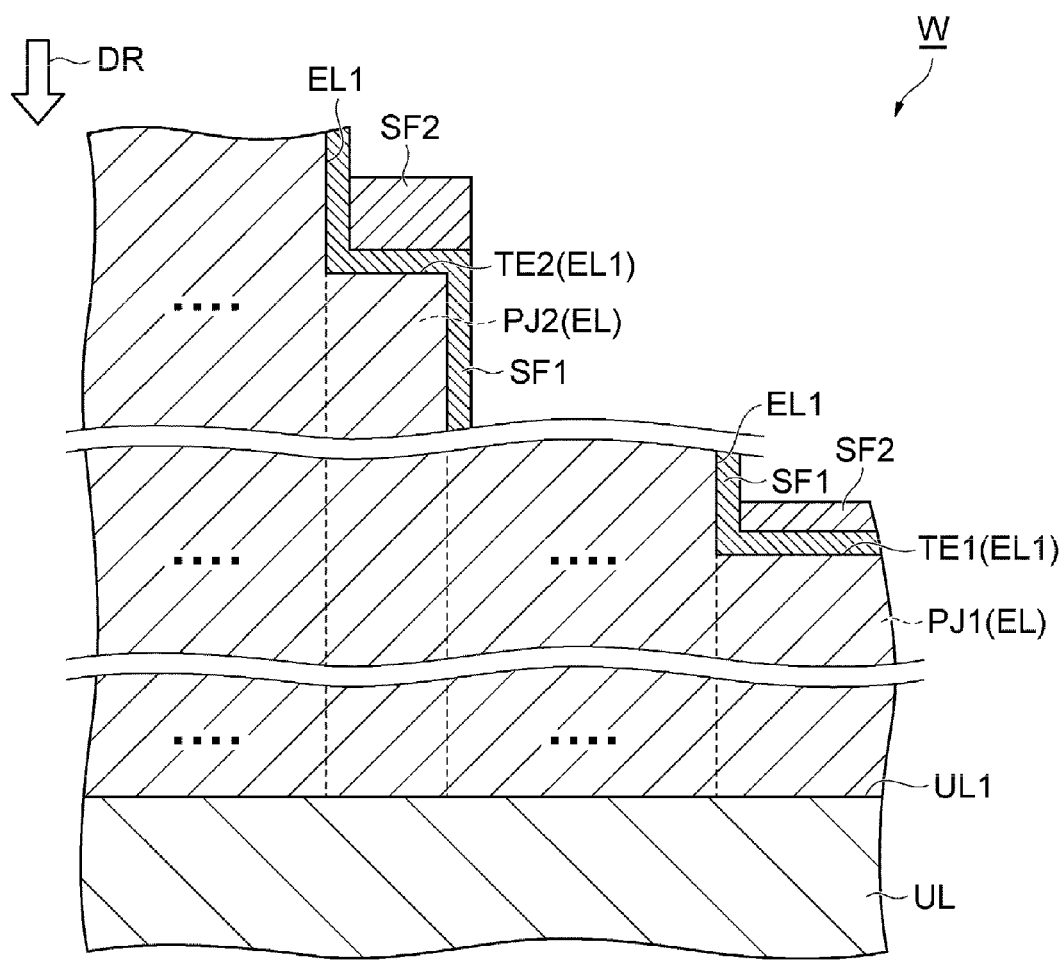
FIG. 20 is a cross sectional view illustrating a state of the part of the processing target object in the middle of performing the method of FIG. 17.

Referring back to FIG. 17, in the method MTC, the process ST12 is then performed. In the process ST12, a second film SF2 is formed on the first film SF1. The second film SF2 is made of silicon oxide. In the process ST12, the second film SF2 is formed such that the thickness thereof increases as a distance of a formation position of the second film SF2 from the main surface UL1 increases. By way of example, as shown in FIG. 20, a thickness of the second film SF2 formed on the first film SF1 on the end surface TE2 of the protruded region PJ2 is larger than a thickness of the second film SF2 formed on the first film SF1 on the end surface TE1 of the protruded region PJ1.

Figure 25B:
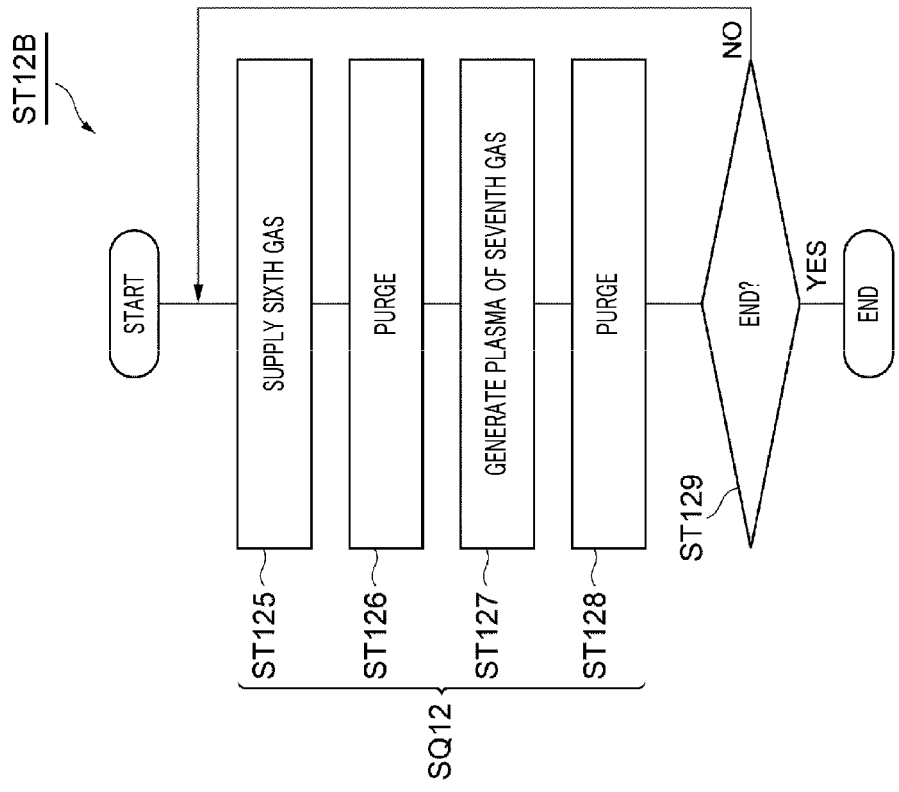
FIG. 25A and FIG. 25B are flowcharts each for describing a part of the processes of the method shown in FIG. 17 in detail.
Figure 25A:
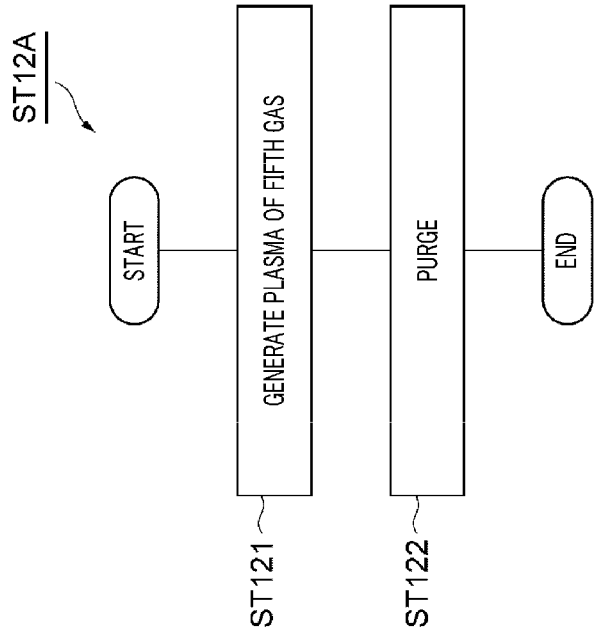

For the film forming processing of the process ST12, a process ST12A shown in FIG. 25A or a process ST12B shown in FIG. 25B may be performed. Hereinafter, the process ST12A and the process ST12B will be described.

The process ST12A includes a process ST121 and a process ST122. In the process ST121, plasma of a fifth gas is generated within the chamber 12c. The fifth gas contains silicon atoms and chlorine atoms or hydrogen atoms. The fifth gas may include a $SiCl_4$ gas or a $SiH_4$ gas. The fifth gas may be a mixed gas including, by way of example, not limitation, a $SiCl_4$ gas or $SiH_4$ gas, an Ar gas and an oxygen gas. In the process ST121, the fifth gas is supplied into the chamber 12c from the gas supply unit 44. Further, the pressure of the chamber 12c is set to a predetermined pressure by the gas exhaust device 38. Further, the high frequency powers are respectively supplied to the inner antenna element 52A and the outer antenna element 52B from the high frequency power supply 70A and the high frequency power supply 70B. Further, the high frequency bias power may be supplied to the lower electrode 18 from the high frequency power supply 30. In the process ST121, the fifth gas is excited into the plasma, and the second film SF2 is formed on the first film SF1 by silicon and oxygen from the plasma. In the subsequent process ST122, a purge of the chamber 12c is performed. The purge of the process ST122 is the same as the purge of the process ST11b.

The process ST12B includes a process ST125, a process ST126, a process ST127 and a process ST128. The process ST125, the process ST126, the process ST127 and the process ST128 constitute a sequence SQ12. In the process ST12B, the sequence SQ12 is performed one or more times.

In the process ST125, a sixth gas is supplied. The sixth gas includes silicon atoms and chlorine atoms. The sixth gas may be a mixed gas containing, by way of non-limiting example, a $SiCl_4$ gas and an Ar gas. In the process ST125, the sixth gas is supplied into the chamber 12c from the gas supply unit 44. Further, the pressure of the chamber 12c is set to a predetermined pressure by the gas exhaust device 38. In the process ST125, plasma is not generated. In the process ST125, silicon-containing molecules in the sixth gas adhere to a surface of the first film SF1 as a precursor. Then, in the subsequent process ST126, the chamber 12c is purged. The purge in the process ST126 is the same as the purge in the process ST11b. By performing the process ST126, molecules excessively adhering to the first film SF1 can be removed.

In the subsequent process ST127, plasma of a seventh gas is generated within the chamber 12c. The seventh gas includes a gas containing oxygen atoms. The seventh gas may be a mixed gas containing, by way of non-limiting example, an oxygen gas and an Ar gas. In the process ST127, the seventh gas is supplied into the chamber 12c from the gas supply unit 44. Further, the pressure of the chamber 12c is set to a predetermined pressure by the gas exhaust device 38. Further, the high frequency powers are respectively supplied to the inner antenna element 52A and the outer antenna element 52B from the high frequency power supply 70A and the high frequency power supply 70B. Further, the high frequency bias power may be supplied to the lower electrode 18 from the high frequency power supply 30. In the process ST127, the seventh gas is excited into the plasma. The layer of the precursor is exposed to active species of the oxygen from the plasma. As a result, the layer of the precursor becomes a silicon oxide film (the second film SF2 or a part thereof). In the subsequent process ST128, a purge of the chamber 12c is performed. The purge in the process ST128 is the same as the purge in the process ST11b.

In a subsequent process ST129, it is determined whether the sequence SQ12 is to be ended. To elaborate, in the process ST129, it is determined whether a repetition number of the sequence SQ12 has reached a preset number. If it is determined in the process ST129 that the repetition number of the sequence SQ12 has not reach the preset number, the sequence SQ12 is performed again. Meanwhile, if it is determined in the process ST129 that the repetition number of the sequence SQ12 has reached the preset number, the process ST12B is ended. A thickness of the second film SF2 is defined by the repetition number of the sequence SQ12. That is, the thickness of the second film SF2 increases as the repetition number of the sequence SQ12 increases. The repetition number of the sequence SQ12 is set based on a required thickness of the second film SF2.

Figure 21:
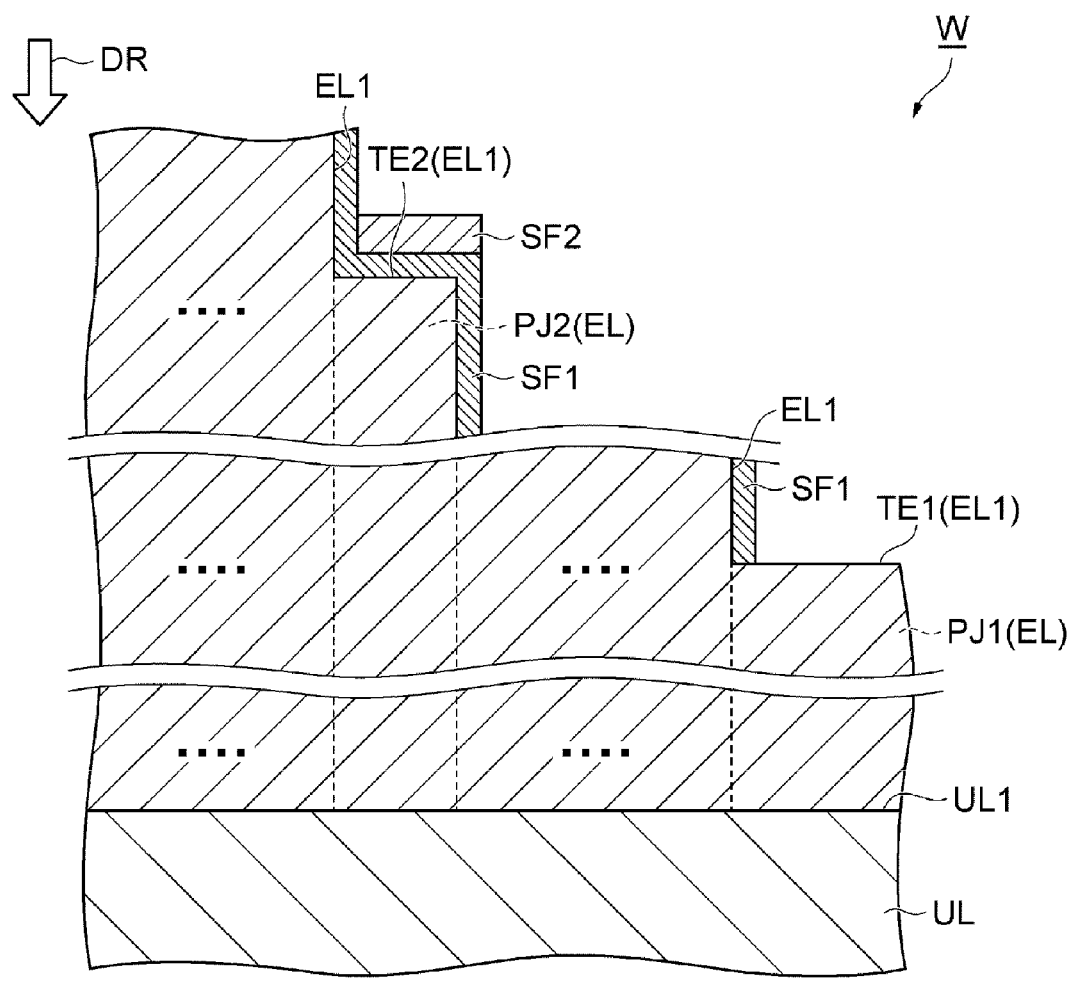
FIG. 21 is a cross sectional view illustrating a state of the part of the processing target object in the middle of performing the method of FIG. 17.

Referring back to FIG. 17, in the method MTC, a process ST13 is then performed. In the process ST13, anisotropic etching is performed on the first film SF1 and the second film SF2. Accordingly, the first film SF1 and the second film SF2 on one or more protruded regions among the plurality of protruded regions are removed. By way of example, as depicted in FIG. 21, the first film SF1 and the second film SF2 on the end surface TE1 of the protruded region PJ1 are removed.

In the process ST13, plasma of an eighth gas is generated within the chamber 12c. The eighth gas may include a fluorocarbon-based gas. The fluorocarbon-based gas contains fluorocarbon ($C_xF_y$) and/or hydrofluorocarbon ($C_xH_yF_z$). By way of example, the fluorocarbon-based gas may include one or more of $CF_4$, $C_4F_8$ and $CHF_3$. In the process ST13, the eighth gas is supplied into the chamber 12c from the gas supply unit 44. Further, the pressure of the chamber 12c is set to a predetermined pressure by the gas exhaust device 38. In addition, the high frequency powers are respectively supplied to the inner antenna element 52A and the outer antenna element 52B from the high frequency power supply 70A and the high frequency power supply 70B. Further, the high frequency bias power may be supplied to the lower electrode 18 from the high frequency power supply 30. Accordingly, ions are attracted to the processing target object W from the plasma, and the anisotropic etching of the first film SF1 and the second film SF2 is performed.

A complex film including the first film SF1 and the second film SF2 formed at a position having a small distance from the main surface UL1 is thin, whereas a complex film including the first film SF1 and the second film SF2 formed at a position having a large distance from the main surface UL1 is thick. Accordingly, in the process ST13, it is possible to remove, among the end surfaces of the plurality of protruded regions, a part of the end-surface-shaped complex film having the small distance from the main surface UL1. For example, as shown in FIG. 21, the first film SF1 and the second film SF2 on the end surface TE1 of the protruded region PJ1 are removed. The second film SF2 on the end surface TE2 of the protruded region PJ2 are left, although the thicknesses thereof is reduced. The remaining first film SF1 and the remaining second film SF2 become the second region.

Figure 22:
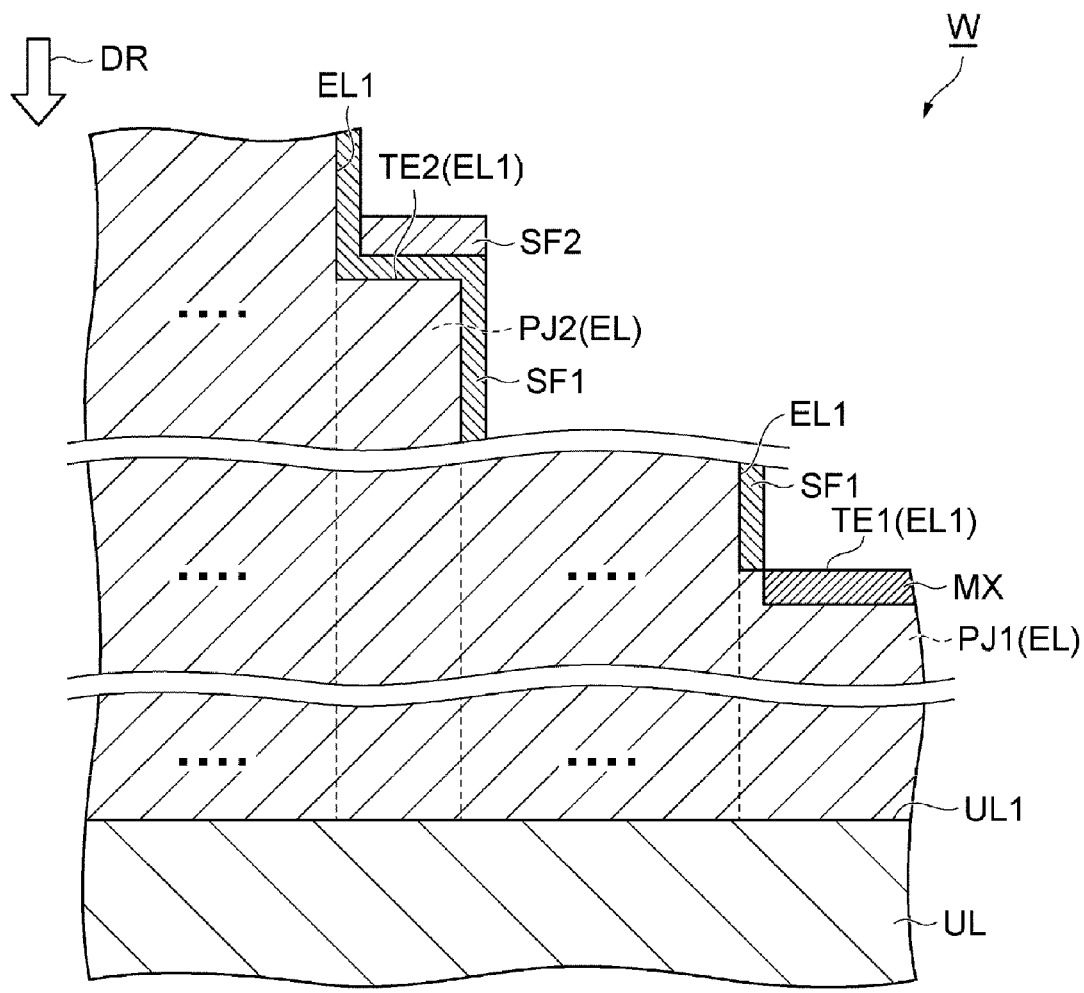
FIG. 22 is a cross sectional view illustrating a state of the part of the processing target object in the middle of performing the method of FIG. 17.
Figure 23:
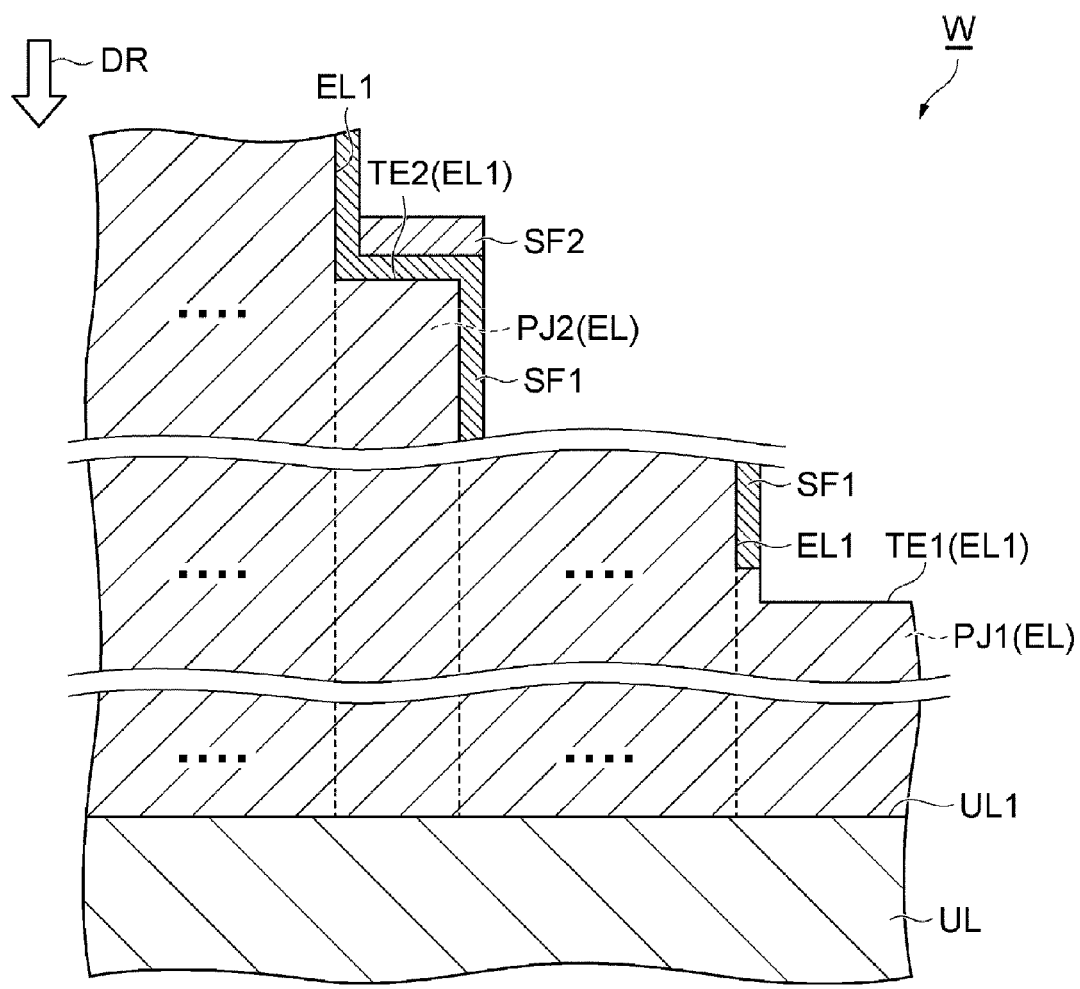
FIG. 23 is a cross sectional view illustrating a state of the part of the processing target object after the method of FIG. 17 is performed.

In a subsequent process ST14, the first region, that is, the protruded region having the exposed end surface among the plurality of protruded regions is selectively etched against the second region, that is, the first film SF1 and the second film SF2. In the process ST14, the sequence including the above-described processes ST1 and ST2 is performed one or more times. In the process ST1, among the plurality of protruded regions, a part of the protruded region, whose end surface is exposed, including the corresponding end surface is modified. By way of example, as shown in FIG. 22, a part of the protruded region PJ1 including the end surface TE1 thereof is modified into a modified region MX. In the subsequent process ST2, the modified region MX is selectively removed, as illustrated in FIG. 23.

The method MTC can be performed in the manufacture of, by way of example, a fin type field effect transistor as well as in the etching of a part of the protruded regions of the processing target object W shown in FIG. 18. In the manufacture of the fin type field effect transistor, a processing target object has a fin region and multiple gate regions. The fin region provides a source region, a drain region and a channel region. The multiple gate regions are arranged on the fin region. Between neighboring gate regions, the fin region is covered with a silicon nitride film. In the manufacture of the fin type field effect transistor, there is performed a processing of removing the silicon nitride film and exposing the fin region (the source region and the drain region) between the neighboring gate regions while protecting the multiple gate regions. This processing is performed to form a contact to the fin region (the source region and the drain region). The method MTC may be performed for this processing.

So far, the various exemplary embodiments have been described. However, the exemplary embodiments are not limiting, and various modifications may be made. Though the above-described plasma processing apparatus 10 is configured as the inductively coupled plasma processing apparatus, various other types of plasma processing apparatuses such as an ECR (Electron Cyclotron Resonator) type plasma processing apparatus, a capacitively coupled plasma processing apparatus, and a plasma processing apparatus using a surface wave such as a microwave in generation of plasma may be used in the various exemplary embodiments and the modifications thereof.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. An apparatus for etching, comprising:
a chamber having a gas inlet and a gas outlet;
a substrate support disposed within the chamber and including an electrode to which a radio frequency bias power is to be supplied;
a plasma generator; and
a controller configured to cause:
(a) placing a substrate, on the substrate support, including a first region made of silicon nitride and a second region made of silicon oxide;
(b) modifying the first region by a hydrogen plasma generated from a first gas with supplying the radio frequency bias power to the substrate; and
(c) after (b), removing the modified first region by a fluorine plasma generated from a second gas without supplying the radio frequency bias power to the substrate,
wherein the controller is further configured to cause supplying a $H_2$ gas and a $NF_3$ gas through the gas inlet in (c), and
a flow rate of the $H_2$ gas in the second gas to the $NF_3$ gas in the second gas is equal or higher than ¾.

2. The apparatus of claim 1,
wherein the controller is further configured to cause performing a plurality of sequences each of which includes (b) and (c) in order.

3. The apparatus of claim 2,
wherein the controller is further configured to cause:
(d) determining that a stop condition is satisfied when a repetition number of the plurality of sequences reaches a preset number, and
(e) determining that the stop condition is not satisfied when the repetition number of the plurality of sequences does not reaches the preset number.

4. The apparatus of claim 1,
wherein the plasma generator comprises an inductively coupled plasma antenna, and
the controller is further configured to cause supplying a radio frequency power to the inductively coupled plasma antenna in (b).

5. The apparatus of claim 1,
wherein the plasma generator comprises an inductively coupled plasma antenna, and
the controller is further configured to cause supplying a radio frequency power to the inductively coupled plasma antenna in (c).

6. The apparatus of claim 1,
wherein in (a), the controller is further configured to cause:
(a1) forming a silicon oxide layer on a silicon nitride layer; and
(a2) etching the silicon oxide layer to expose a portion of the silicon nitride layer, and
the exposed portion of the silicon nitride layer is the first region, and the silicon oxide layer is the second region.

7. The apparatus of claim 6,
wherein in (a1), the controller is further configured to cause:
(a11) exposing the silicon nitride layer to a third gas to form a precursor layer on the silicon nitride layer; and
(a12) exposing the precursor layer to a fourth gas to form the silicon oxide layer.

8. The apparatus of claim 7,
wherein the controller is further configured to cause supplying an organic-containing aminosilane-based gas through the gas inlet in (a11).

9. The apparatus of claim 7,
wherein the controller is further configured to cause supplying a gas containing oxygen atoms through the gas inlet in (a12).

10. The apparatus of claim 1,
wherein the controller is further configured to cause supplying a $NF_3$ gas through the gas inlet in (b).

11. The apparatus of claim 1,
wherein a ratio of a number of atoms of the hydrogen in the second gas to a number of atoms of the fluorine in the second gas is equal to or higher than $8/5$.

12. The apparatus of claim 1,
wherein the controller is further configured to cause supplying a $H_2$ gas through the gas inlet in (b).

13. The apparatus of claim 1,
wherein the controller is further configured to supplying oxygen through the gas inlet in (c).

14. An apparatus for selectively etching a first region relative to a second region on a main surface of a substrate, the first region being made of silicon nitride, the second region being made of silicon oxide, the apparatus comprising:
a chamber having a gas inlet and a gas outlet;
a substrate support disposed within the chamber and including an electrode;
a gas supply configured to supply a gas into the chamber;
an RF supply configured to supply a RF signal to the electrode; and
a controller configured to cause:
(a) placing the substrate on the substrate support;
(b) forming a first plasma from a first gas containing hydrogen with the RF signal,
(c) exposing the substrate to the first plasma to modify the first region;
(d) forming a second plasma from a second gas containing fluorine without the RF signal;
(e) exposing the substrate to the second plasma to remove the modified first region,
wherein the first region has a plurality of protruded regions, of which heights are different from each other,
a first film is formed on the first region, and
a second film is formed on the first film.

15. The apparatus of claim 14,
wherein a thickness of the second film increases as a height of a formation position of the second film from the main surface increases.

16. A plasma processing apparatus equipped with an ICP (Inductively Coupled Plasma) type plasma source, comprising:
a chamber having a gas inlet and a gas outlet;
a substrate support disposed within the chamber;
a plasma generator; and
a controller configured to cause:
(a) placing a substrate, on the substrate support, including a first region made of silicon nitride, a second region made of silicon oxide and a third region made of silicon;
(b) modifying the first region by a hydrogen plasma generated from a first gas; and
(c) after (b), removing the modified first region by a fluorine plasma generated from a second gas,
wherein the second region is provided at both sides of the third region, and the third region is protruded above the second region,
the first region is provided to cover the second region and the third region, and
the first gas further includes an oxygen-containing gas.

17. The apparatus of claim 16,
wherein the oxygen-containing gas includes at least one of an $O_2$ gas, a CO gas, a $CO_2$ gas, a NO gas, a $NO_2$ gas, a $N_2O$ gas and a $SO_2$ gas.

18. The apparatus of claim 16,
a flow rate ratio of the oxygen-containing gas in the first gas to a hydrogen-containing gas in the first gas is in a range from $3/100$ to $9/100$.

* * * * *